(12) United States Patent
Hirata et al.

(10) Patent No.: US 7,696,546 B2
(45) Date of Patent: Apr. 13, 2010

(54) SOLID-STATE IMAGING DEVICE HAVING WIRING LAYER WHICH INCLUDES LAMINATION OF SILICIDE LAYER IN ORDER TO REDUCE WIRING RESISTANCE, AND MANUFACTURING METHOD FOR THE SAME

(75) Inventors: Tatsuya Hirata, Osaka (JP); Shouzi Tanaka, Nara (JP); Ryohei Miyagawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 113 days.

(21) Appl. No.: 12/015,930

(22) Filed: Jan. 17, 2008

(65) Prior Publication Data

US 2008/0173911 A1    Jul. 24, 2008

(30) Foreign Application Priority Data

Jan. 19, 2007   (JP) .............................. 2007-010457
Oct. 4, 2007    (JP) .............................. 2007-261208

(51) Int. Cl.
*H01L 31/062* (2006.01)
(52) U.S. Cl. ..................... 257/292; 257/255; 257/290; 257/394; 257/347; 257/E27.131; 257/E27.132; 257/E29.093; 257/E29.113; 438/48; 438/57; 438/59; 438/75; 438/98
(58) Field of Classification Search ................ 257/255, 257/292, 347, E27.131, E27.132, E29.093, 257/E29.113; 438/48, 57, 59, 75, 98
See application file for complete search history.

(56) References Cited

U.S. PATENT DOCUMENTS 6,930,337 B2 *   8/2005   Rhodes ....................... 257/292
7,456,453 B2 *  11/2008   Inoue ......................... 257/292
2001/0025970 A1  10/2001   Nozaki et al.
2003/0137008 A1   7/2003   Nozaki et al.

FOREIGN PATENT DOCUMENTS

| EP | 1 075 028 A2 | 2/2001 |
| JP | 2001-111022 | 4/2001 |
| JP | 3782297 | 3/2006 |

OTHER PUBLICATIONS

Goto et al. "A New Leakage Mechanism of Co Salicide and Optimized Process Conditions" IEEE Transactions on Electron Devices, vol. 46, No. 1, Jan. 1, 1999 pp. 117-123.
Goto et al., "Leakage Mechanism and Optimized Conditions of Co Salicide Process for Deep-Submicron CMOS Devices", IEEE IEDM 95, pp. 449-452, (1995).

* cited by examiner

*Primary Examiner*—Dao H Nguyen
(74) *Attorney, Agent, or Firm*—McDermott Will & Emery LLP

(57) ABSTRACT

A silicide layer (first silicide layer, second silicide layer) is laminated on top laminate surfaces of gates of a transmission transistor and a reset transistor, respectively. Each of the first silicide layer and the second silicide layer respectively formed on each of the gates extends in a direction along the main surface of the semiconductor substrate among at least a portion of a plurality of image pixels, connecting gates with one another among the respective image pixels. On the other hand, a signal outputter is not in contact with any silicide layers, has the top laminate surface that is covered with an insulating layer, and is connected with other transistors via a metal wiring layer.

8 Claims, 17 Drawing Sheets

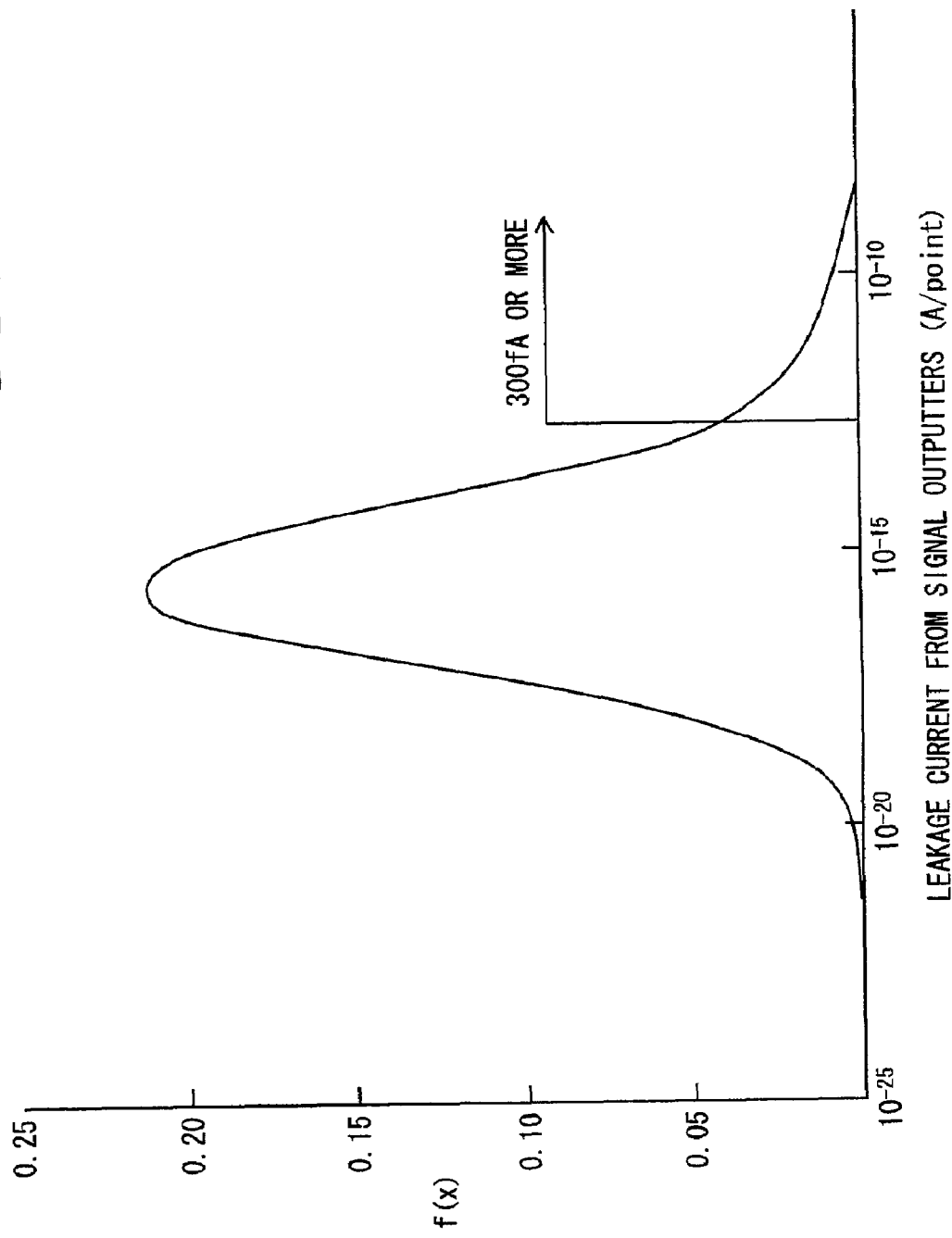

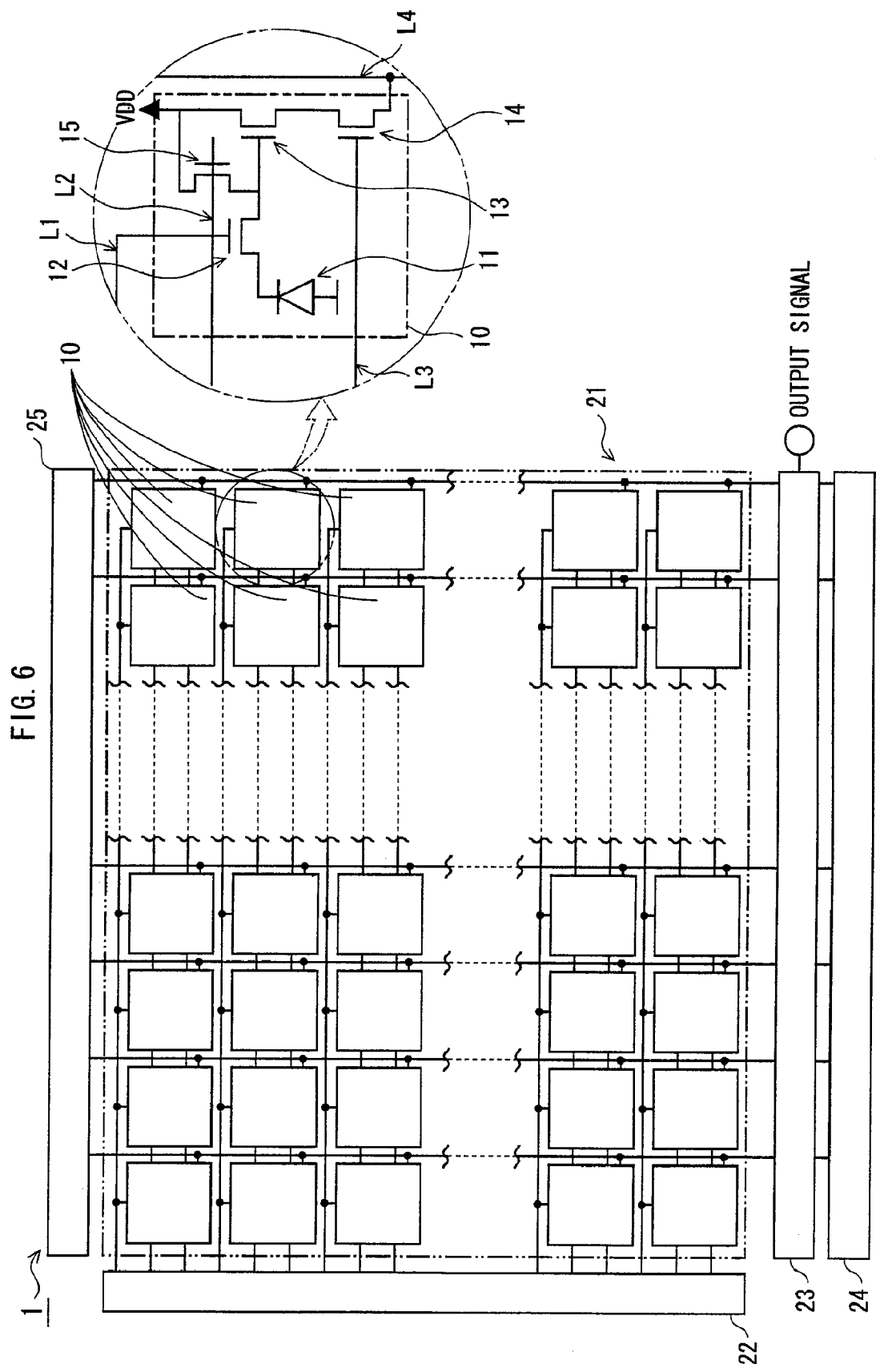

SOLID-STATE IMAGING DEVICE HAVING WIRING LAYER WHICH INCLUDES LAMINATION OF SILICIDE LAYER IN ORDER TO REDUCE WIRING RESISTANCE, AND MANUFACTURING METHOD FOR THE SAME

CLAIM OF PRIORITY

This application claims the benefit of Japanese Patent Application No. JP 2007-010457, filed on Jan. 19, 2007 and Japanese Application No. JP 2007-261208, filed on Oct. 4, 2007, the disclosures of which are incorporated herein by reference.

BACKGROUND OF THE INVENTION (1) Field of the Invention

The present invention relates to a solid-state imaging device and a manufacturing method for the same, in particular to a structure of an image pixel of a MOS-type solid-state imaging device and a forming method thereof.

(2) Description of the Related Art

MOS-type solid-state imaging devices which are used in digital cameras and the like can be driven with a lower power consumption compared to CCD-type solid-state imaging devices. Also, a sensor region of the MOS-type solid-state imaging device and a peripheral circuit region thereof for driving the sensor region can be manufactured based on the same CMOS processing. Thus, their manufacturing processes can be more simplified, and semiconductor devices can be more integrated, compared to the CCD-type solid-state imaging devices. The structure of the conventional MOS-type solid-state imaging devices will be described using an example of an amplification-type MOS-type solid-state imaging device.

As shown in FIG. 1, the sensor region of the MOS-type solid-state imaging device includes a plurality of image pixels 60 (FIG. 1 shows 4 of the image pixels 60). Each image pixel 60 includes a photodiode 61 and 4 transistors (a transmission transistor 62, an amplifier transistor 63, a selection transistor 64, and a reset transistor 65) as its main components.

In the plurality of image pixels 60 that are two-dimensionally arranged along the direction of the paper surface of FIG. 1, gates of the transmission transistors 62 are connected with one another by lines L61. Likewise, gates of reset transistors 65 are connected with one another by lines L62, and gates of selection transistors 64 are connected with one another by lines L63. Also, in the plurality of image pixels 60 two-dimensionally arranged along the direction of the paper surface of FIG. 1, sources of the selection transistors 64 are connected with one another by lines L64.

Among structural components of the image pixel 60 shown in FIG. 1, the transmission transistor 62 and its peripheral regions will be described using FIG. 2A, and the reset transistor 65 and its peripheral regions will be described using FIG. 2B.

As shown in FIG. 2A, at the transmission transistor 62 and the peripheral regions thereof, an n-type signal charge accumulator 602 is formed in a p-well (p-type device formation region) 601 on a semiconductor substrate 600. Also, a p-type surface shield layer 606 and an n-type signal outputter 605 are formed in a vicinity of the surface of the p-well 601. The n-type signal charge accumulator 602 is a component comprising part of a photodiode and accumulates signal charges generated by receiving incident light.

The p-type surface shield layer 606 is formed in an upper area with respect to the n-type signal charge accumulator 602 (the p-well 601 surface side) in order to reduce dark current. The n-type signal outputter 605 is formed away from both the n-type signal charge accumulation 602 and the p-type surface shield layer 606. Also, an insulating layer 603 is formed on a region between the p-type surface shield layer 606 and the n-type signal outputter 605 of the p-well 601. Further, a gate 604 of the transmission transistor 62 for controlling transmission of signal charge is provided on the insulating layer 603. Additionally, the gate 604, the signal outputter 605, and the surface shield layer 606 are covered with an insulating layer 621.

Also, an STI (Shallow Trench Isolation) region 607 is formed adjacent to the surface shield layer 606 (in FIG. 2A, adjacent to the left side of the surface shield layer 606). It should be noted the STI region 607 is formed in regions separating adjacent image pixels 60 and the like.

As shown in FIG. 2B, at the reset transistor 65 and peripheral regions thereof, a source 611 and a drain 612 of the reset transistor 65 are formed apart from each other in a vicinity of one of the surfaces of the p-well 601 formed on the semiconductor substrate 600. Also, the insulating layer 603 is formed above a region between the source 611 and the drain 612 of the semiconductor substrate, and the gate 613 is provided on the insulating layer 603. The source 611, the drain 612, and the gate 613 are covered with the insulating layer 621.

As shown in FIG. 1, in the sensor region of the MOS-type solid-state imaging device, the transistors 62 to 65 of the plurality of image pixels 60 are connected to one another, respectively, by such as the lines L61 to L64. Wiring lengths can be extremely long, and are likely to cause an increase in wiring resistance if the wirings are to be extended to connect with gates and the like. The following describes conventional techniques developed in attempts to solve this problem, with reference to FIG. 3.

As shown in FIG. 3, the conventional MOS-type solid-state imaging devices are structured in such a manner that metal wirings 633a to 633c are provided on each of the gate 604 of the transmission transistor 62 and the gate 613 of the reset transistor 65, and the gates 604 and 613 are connected with the metal wirings 633a and so on with contact plugs 641, respectively. The conventional MOS-type solid-state imaging devices attempt to reduce wiring resistance by adopting such a structure. However, as shown in FIG. 3, an insertion of the metal wirings 633a to 633c causes a problem, that is, an increase in a light path length, a distance D0, from the on-chip lens 631 to the signal charge accumulator 602 via a color filter 632. Since the distance D0 directly affects the sensitivity of the MOS-type solid-state imaging device, with the conventional MOS-type solid-state imaging devices, it is difficult to reduce wiring resistance while also preventing deterioration of the sensitivity. Additionally, as shown in FIG. 3, the sensitivity deteriorates due to a decrease in a light receivable angle $\theta_0$ also.

Various attempts have been made to solve the above-mentioned problem. For example, one technique uses a salicide method in laminating a silicide layer on gates, a signal outputter and the like and connects the image pixels 60 with this silicide layer in order to reduce resistance. Another technique attempts to reduce resistance by forming a silicide layer at peripheral circuits with similar use of the salicide method (for examples, see Japanese laid-open patent application publication No. 2001-111022 and Japanese Patent No. 3782297).

However, when adopting the techniques proposed by the above-mentioned documents (Japanese laid-open patent application publication No. 2001-111022 and Japanese Patent No. 3782297), it is difficult to reduce electrical resistance among the image pixels and prevent the deterioration of playback images at the same time. Specifically, with the technique proposed as a first embodiment of the above-mentioned document (Japanese laid-open patent application publication No. 2001-111022), no silicide layer is formed at a sensor region where image pixels are formed, and thus, wiring resistance cannot be reduced sufficiently. Accordingly, in view of the sensitivity characteristics, it is difficult to adopt the technique proposed as the first embodiment of the above-mentioned document (Japanese laid-open patent application publication No. 2001-111022).

On the other hand, according to a second embodiment of the above-mentioned document (Japanese laid-open patent application publication No. 2001-111022) and the other document mentioned above (Japanese Patent No. 3782297), a silicide layer is formed on everything except for a light receiver of a photoelectric converter in a pixel cell, including drains of transmission transistors. Consequently, when adopting the technique proposed by these, leakage current is likely to occur, and thus, noise is likely to occur due to aliasing output from the signal outputter 605.

A junction depth of the signal outputter 605 and the source 611 of the reset transistor 65 is 0.1 [μm] to 0.5 [/μm], and this could be reduced down to approximately 0.05 [μm] to 0.1 [μm] if a pixel size is further miniaturized. Abstracts of 1995 IEEE-IEDM (International Electron Devices Meeting) pp. 449-452 contain a description that cobalt silicide spikes reach a length of 20 [nm] to 100 [nm]. Here, as shown in FIG. 4, a junction between an impurity diffusion layer and a silicon substrate is destroyed due to a cobalt silicide spike, causing leakage current to occur from the impurity diffusion layer to the silicon substrate.

IEEE TRANSACTIONS ON ELECTRON DEVICES, VOL. 46, No. 1, JANUARY 1999 pp. 117-123 contains descriptions on mechanism caused by cobalt silicide, such as that cobalt diffuses from a cobalt silicide layer due to a thermal process, increasing leakage current, and the leakage current value has a distribution within a region, in addition to that the cobalt silicide spikes reach a length of 20 [nm] to 100 [nm].

In other words, according to the techniques proposed by the second embodiment of the above-mentioned document (Japanese laid-open patent application publication No. 2001-111022) and the other document (Japanese Patent No. 3782297), a silicide layer is laminated on the signal outputter 605 and the source 611 of the reset transistor 65 as well as on the gate 604 of the transmission transistor 62 and the gate 613 of the reset transistor 65. As a result, a metal-semiconductor compound, the component of the silicide layer, penetrates to the p-well (p-type device formation region) 601 or even if it does not penetrate to the p-well 601, it shortens the distance to the p-well 601. Consequently, leakage current increases and has a distribution with in the region.

Due to an increase in the number of pixels for cameras in recent years, when practically used, the signal outputter 605 and the source 611 of the reset transistor 65 electrically connected to the signal outputter 605 are placed in each of several million to ten million pixels in a pixel array. Also, when the peripheral temperature of the several million to ten million sources 611 of the reset transistors 65, which are electrically connected to the several million to ten million of signal outputters 605 and the signal outputters 605, is 60[° C.], leakage current indicates a distribution as shown in FIG. 5 under the condition, for example, that a total area of the signal outputters 605 and the sources 611 of the reset transistors 65 is 0.48[μm$^2$].

FIG. 5 shows a case where a sample time for transmitting a signal downstream for an output to eliminate noise is 4.88 [μsec] and a saturation number of electrons of the signal charge accumulator 602 is 3000. In this case, 90 electrons or more, which approximately account for 3[%] of the saturation number corresponding to a dynamic range of a playback image, that is, image pixels with a leakage current of approximately 300 [fA] or more in the maximum applicable temperature, become visible as a noise in the playback image. As can be seen from the above, the techniques proposed by the second embodiment of the above-mentioned document (Japanese laid-open patent application publication No. 2001-111022) and the other document mentioned above (Japanese Patent No. 3782297) suffer deterioration of playback images due to leakage current generation as a tradeoff for gaining an advantage of reducing wiring resistance by forming silicide layers.

SUMMARY OF THE INVENTION

The present invention was conceived in view of the above problems, and aims to provide a solid-state imaging device which achieves high-sensitivity characteristics by preventing deterioration of playback images due to leakage current and suppressing a distance from an on-chip lens to the surface of the semiconductor substrate.

In order to achieve the stated aim, the present prevention provides a solid-state imaging device in which a plurality of image pixels are disposed in a direction along a main surface of a semiconductor substrate, each of the plurality of image pixels including the following: a signal charge accumulator operable to accumulate a signal charge generated by a photoelectric conversion; a transmission transistor disposed adjacent to the signal charge accumulator; and a reset transistor, a source of which is connected to a drain of the transmission transistor, And, in the solid-state imaging device in accordance with the present invention, one of (a) the drain of the transmission transistor and (b) a point on a signal path connecting the drain of the transmission transistor and the source of the reset transistor functions as a signal outputter. Also, in the solid-state imaging device in accordance with the present invention, a gate of the transmission transistor is in contact with a first compound layer composed of metal and a semiconductor, and a gate of the reset transistor is in contact with a second compound layer composed of metal and a semiconductor.

In the solid-state imaging device of the present invention, gates of transmission transistors of at least two of the image pixels are electrically connected with each other by the first compound layer which extends in the direction along the main surface, and gates of reset transistors of the at least two of the image pixels are electrically connected with each other by the second compound layer which extends in the direction along the main surface.

In the solid-state imaging device of the present invention, the signal outputter (i) is out of contact with the first compound layer, the second compound layer, and any other compound layer composed of metal and a semiconductor, (ii) has a top surface that is covered with an insulating layer, and (iii) is electrically connected with a metal wiring layer so as to be connected with other transistors (transistors other than the transmission transistor and the reset transistor), the metal wiring layer being disposed on the insulating layer.

It should be noted that the above-mentioned "top surface" is a top surface in the laminating direction.

Also, it should be noted that the above phrase "out of contact" means "not in direct contact".

In the solid-state imaging device of the present invention, each of the gates of the transmission transistor and the reset transistor is in contact with the first compound layer and the second compound layer (compound layers composed of metal and a semiconductor), and the first and the second compound layers are formed in one piece, respectively, so as to connect the gates of at least a portion of the plurality of the image pixels. As stated above, the gates of the transmission transistors and the reset transistors are connected with each other by the first compound layer and the second compound layer, respectively. Accordingly, the solid-state imaging device in accordance with the present invention, unlike the conventional solid-state imaging devices shown in FIGS. 2 and 3, does not need to have a structure in which the gates are connected by metal wiring layers formed corresponding to the gates via the insulating layer and the gates of the image pixels are electrically connected via the metal wiring layers. Consequently, the solid-state imaging device of the present invention can reduce electric resistance among the gates while achieving a shorter distance from the on-chip lens to the surface of the semiconductor substrate, compared to the conventional solid-state imaging device shown in FIGS. 2 and 3. Also, the solid-state imaging device of the present invention achieves high sensitivity characteristics since the light receiving angle is not likely to decrease.

Additionally, in the solid-state imaging device in accordance with the present invention, the signal outputter is not in contact with any compound layers (any compound layers composed of metal and a semiconductor, including the first and the second compound layers). This prevents penetration of a metal-semiconductor compound to a p-well (p-type device formation region), preventing generation of leakage current as a result. Here, when the peripheral temperature of the several million to ten million signal outputters and the sources of the reset transistors, which are electrically connected to the signal outputters is 60[° C.], leakage current shows a distribution as shown in FIG. 5 (indicated by a dashed line) in a case where, for example, a total area of the signal outputters and the sources of the reset transistors is 0.48 [m²]. And, the number of the image pixels with a leakage current of approximately 300 [fA] or more, where the leakage current becomes visible as a noise in a playback image, decreases compared to when a silicide layer is formed on the signal outputter. Consequently, the MOS-type solid-state imaging device in accordance with the present invention is less likely to cause noise due to leakage current, suppressing deterioration of playback images.

Accordingly, the MOS-type solid-state imaging device prevents playback images from deteriorating due to leakage current while achieving the high sensitivity characteristics.

Here, the source of the reset transistor charges a floating diffusion layer to a reset level, and the signal outputter converts electrons accumulated at the signal charge accumulator to a voltage change of the floating diffusion layer. In other words, neither of these outputs current, and thus, it is not necessary to laminate a silicide layer thereover to lower resistance.

The solid-state imaging device of the present invention can adopt a structure in which the source of the reset transistor (i) is out of contact with the first compound layer, the second compound layer, and any other compound layer (composed of metal and a semiconductor), (ii) has a top surface that is covered with an insulating layer, and (iii) is electrically connected with a metal wiring layer disposed on the insulating layer, and the source of the reset transistor and the signal outputter are electrically connected.

Also, the solid-state imaging device of the present invention can adopt a structure in which the drain of the reset transistor is in contact with a third compound layer composed of metal and a semiconductor.

Additionally, the solid-state imaging device of the present invention can adopt a structure in which a peripheral circuit region including a plurality of transistors is positioned at a periphery of where the plurality of image pixels are disposed in the direction along the main surface of the semiconductor substrate, and sources, drains, and gates of the plurality of transistors are in contact with a fourth compound layer composed of metal and a semiconductor so as to be electrically connectable.

In addition, the solid-state imaging device of the present invention can adopt a structure in which the first compound layer and the second compound layer are formed using a salicide method.

Also, the solid-state imaging device of the present invention can adopt a structure in which the plurality of image pixels are grouped into a plurality of pixel groups each composed of two or more adjacent image pixels, and in at least one of the plurality of pixel groups, image pixels thereof share one signal outputter.

Additionally, the solid-state imaging device of the present invention can adopt a structure in which a shield layer is disposed on the signal charge accumulator, the shield layer being capable of reducing dark current, and the shield layer (i) is out of contact with the first compound layer, the second compound layer, and any other compound layer composed of metal and a semiconductor and (ii) has a top surface that is covered with an insulating layer.

Also, in order to achieve the stated aim, the present invention provides a manufacturing method for a solid-state imaging device, which comprise the following steps (a) to (g):

(a) a signal charge accumulator forming step of performing, on a semiconductor substrate, formation of a signal charge accumulator which accumulates a signal charge generated by a photoelectric conversion;

(b) a transistor forming step of performing, on the semiconductor substrate, formation of (i) a transmission transistor adjacent to the signal charge accumulator and (ii) a reset transistor, a source of which is connected to a drain of the transmission transistor;

(c) a first insulating layer forming step of forming a first insulating layer so as to cover (i) a main surface of the semiconductor substrate, (ii) the transmission transistor, and (iii) the reset transistor;

(d) a sidewall forming step of forming, by removing the first insulating layer by etching except for a region above the signal charge accumulator, a sidewall on a lateral surface of a gate of the transmission transistor and on both lateral surfaces of a gate of the reset transistor, the lateral surface of the gate of the transmission transistor being on a drain side of the transmission transistor;

(e) a second insulating layer forming step of forming a second insulating layer so as to cover (i) the main surface, (ii) the transmission transistor, and (iii) the reset transistor;

(f) an opening forming step of forming, on the second insulating layer, an opening above the gate of the transmission transistor and above the gate and the drain of the reset transistor; and (g) a compound layer forming step of forming, through the openings, a compound layer composed of metal and a semiconductor on the gate of the transmission transistor and on the gate and the drain of the reset transistor.

With the above steps, the manufacturing method in accordance with the solid-state imaging device in accordance with the present invention enables manufacturing of a solid-state imaging device which achieves high-sensitivity characteristics by preventing deterioration of playback images due to leakage current and suppressing a distance from an on-chip lens to the surface of the semiconductor substrate.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawing:

FIG. 5 is a characteristic diagram showing a distribution of leakage current from signal outputters of the conventional MOS-type solid-state imaging device under the condition that a total area of the signal outputters 605 and sources 611 of the reset transistors 65 is 0.48 [μ/m²] and a peripheral temperature thereof is 60[° C.];

FIG. 6 is a schematic block circuit showing a structure of a MOS-type solid-state imaging device 1 of an embodiment;

DESCRIPTION OF THE PREFERRED EMBODIMENT

Figure 1:
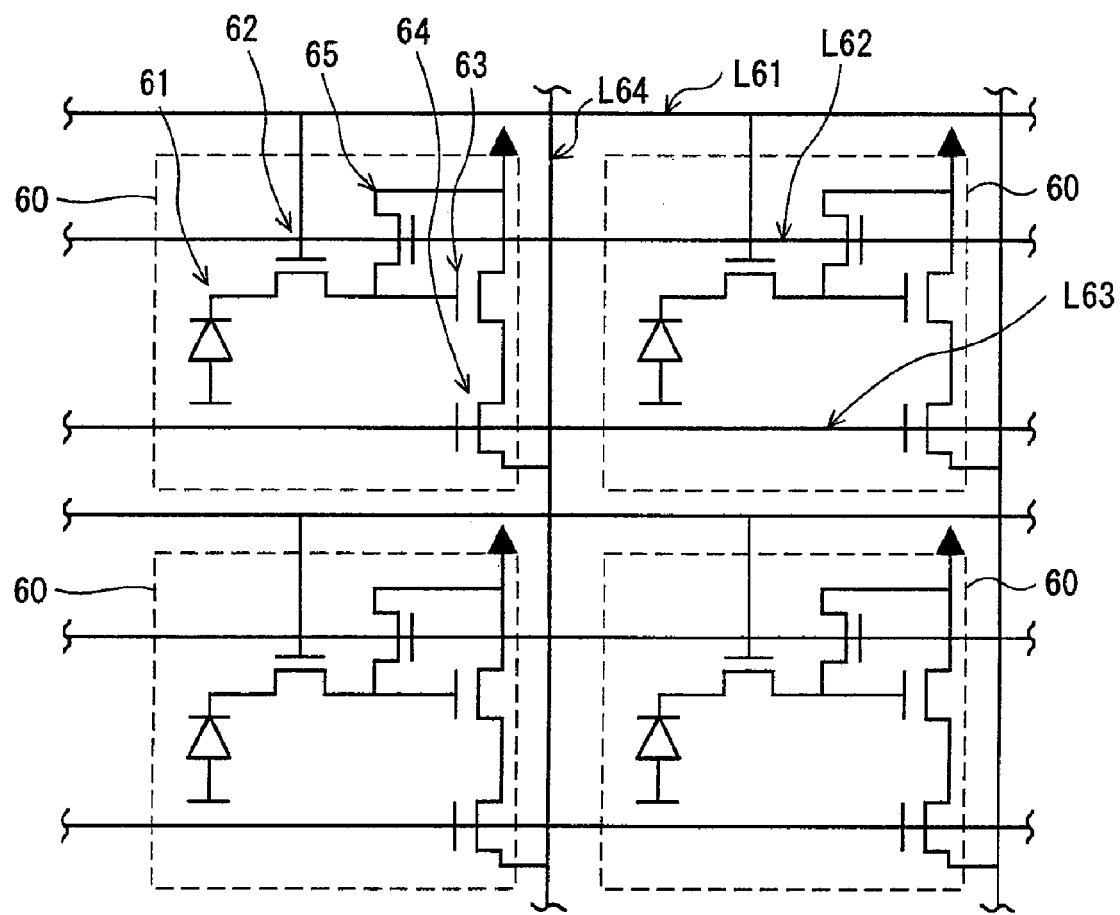
FIG. 1 is a schematic block circuit showing a structure of a sensor region of a conventional MOS-type solid-state imaging device.

The following describes the best mode for carrying out the invention using an embodiment with reference to drawings. Note that the embodiment in the following description is only an example used to provide a clear explanation on a structure of the present invention and effects and advantages obtained therefrom, and the present invention is not limited to this except for its characterizing feature.

1. Overall Structure of MOS-Type Solid-State Imaging Device

An overall structure of a MOS-type solid-state imaging device 1 in accordance with the present embodiment is described using FIG. 6. The MOS-type solid-state imaging device shown in FIG. 6 is, for example, an image input device used for such as a digital still camera or a digital movie camera.

As shown in FIG. 6, the MOS-type solid-state imaging device 1 of the present embodiment includes a sensor region 21 and a peripheral circuit. The sensor region 21 includes multiple image pixels 10. The peripheral circuit includes a vertical selection circuit 22, an image signal retention circuit 23, a horizontal selection circuit 24, and a load circuit 25 and drives the image pixels 10 of the sensor region 21.

(1) Sensor Region 21

The sensor region 21 includes the multiple image pixels 10 which are two-dimensionally disposed on a semiconductor substrate along a main surface thereof. Note that while FIG. 6 does not show the semiconductor substrate, the direction along the main surface of the semiconductor substrate corresponds with the direction along the paper surface.

As shown in a portion surrounded by a two-dot chain line in FIG. 6, the image pixel 10 is an amplification-type unit pixel and each has an identical circuit configuration. The image pixel 10 includes a photodiode 11, 4 transistors (a transmission transistor 12, an amplifier transistor 13, a selection transistor 14, and a reset transistor 15) and the like.

Among the image pixels 10 arranged in a horizontal direction of FIG. 6, gates of the transmission transistors 12 are connected with one another by lines L1, gates of the reset transistors 15 are connected with one another by lines L2, and gates of the selection transistors 14 are connected with one another by lines L3. Also, among the image pixels 10 arranged in a vertical direction, drains of the selection transistors 14 are connected with one another by lines L4. A configuration of each of the lines L1 to L4 will be described later.

The photodiode 11 is a device portion having a photoelectric conversion function which generates signal charge in accordance with intensity of incident light received by each image pixel 10. It should be noted that one end of the photodiode 11 is earthed and the other end is connected with a source of the transmission transistor 12. The transmission transistor 12 is a device portion for transferring the signal charge generated by the photoelectric conversion function of the photodiode 11 to a drain of the transmission transistor 12 itself. The drain of the transmission transistor 12 functions as a detection unit and is connected with a gate of the amplifier transistor 13 and a source of the reset transistor 15.

The reset transistor 15 is a device portion for resetting the signal charge accumulated in the drain of the transmission transistor 12 in a predetermined cycle. The drain of the reset transistor 15 is connected with the power supply voltage VDD. The amplifier transistor 13 is a device portion for outputting the signal charge accumulated in the drain of the transmission transistor 12 when the selection transistor 14 is turned ON according to signals received from a vertical shift resistor 22 and so on. The drain of the amplifier transistor 13 is connected with the power supply voltage VDD, and the source of the amplifier transistor 13 is connected with the drain of the selection transistor 14.

Among the four transistors 12 to 15 in the pixel 10, the amplifier transistor 13 performs a signal amplification function for the signal charge, and the other transistors 12, 14 and 15 each perform a switching function.

(2) Peripheral Circuit

The vertical selection circuit 22 and the horizontal selection circuit 24 are dynamic circuits. They sequentially output drive pulses (switching pulses) to the image pixels 10 or to the pixel signal retention circuit 23 according to a signal received from the load circuit 25.

Also, the image signal retention circuit 23 includes switching devices for each column (not shown in figures), and they are sequentially turned ON by receiving pulses from the horizontal selection circuit 24. The load circuit 25 is a circuit for applying a power supply voltage, a timing pulse, and so on to the above-described vertical selection circuit 22 and the horizontal selection circuit 24.

In the MOS-type solid-state imaging device 1, in accordance with the above-mentioned structure, the signal charge generated by the photoelectric conversion is read from the image pixel 10 at a position where a row selected by the vertical selection circuit 22 intersects with a column whose image signal retention 23 is turned on.

2. Driving Operations of MOS-Type Solid-State Imaging Device

In the image pixel 10, the signal charge generated by the photodiode 11 with use of the photoelectric conversion is temporarily accumulated in the drain (signal outputter) of the transmission transistor 12. The accumulated signal charge is output to the gate of the amplifier transistor 13 when the transmission transistor 12 is turned ON based on instruction signals received from the vertical selection circuit 22. The amplifier transistor 13 amplifies the signal charge input to the gate thereof and outputs it to the source of the selection transistor 14.

The transmission transistor 12 performs ON/OFF operations based on the instruction signals received from the vertical selection circuit 22, and the reset transistor 15 eliminates the signal charge accumulated in the signal outputter in a predetermined cycle to reset the accumulation status of the signal charge in the signal outputter.

In the multiple image pixels 10 of the MOS-type imaging device 1, each of the pixels 10 accumulates the signal charge generated by the photoelectric conversion. In one of these pixels 10, which is selected by the selection transistor 14 in each image pixel 10 and the image signal retention circuit 23 based on the instruction signals received from the vertical selection circuit 22 and the horizontal selection circuit 24, the signal charge is amplified and output to the line L4.

3. Structure of Main Part in Image Pixel 10

In the following, a description will be given on the transmission transistor 12 and its peripheral regions, and the reset transistor 15 and its peripheral regions in the structure of the image pixel 10 of the MOS-type solid-state imaging device 1 in accordance with the present embodiment, with reference to FIGS. 7A and 7B.

(1) Transmission Transistor 12 and Peripheral Regions Thereof

Figure 7A:
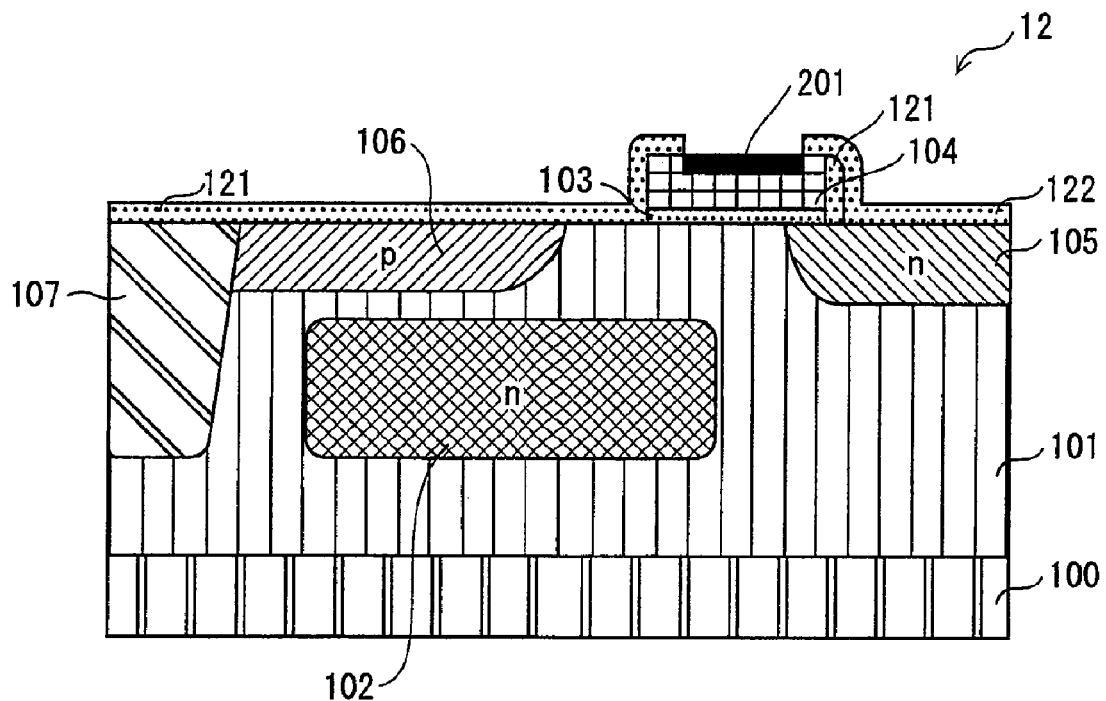
FIG. 7A is a schematic cross-sectional diagram showing a structure of a transmission transistor 12 and peripheral regions thereof of the MOS-type solid-state imaging device 1.

As shown in FIG. 7A, at the transmission transistor 12 and the peripheral regions thereof, an n-type signal charge accumulator 102, a p-type surface shield layer 106, and an n-type signal outputter 105 are formed in correspondence with a p-well 101 included in a semiconductor substrate 100. Here, the signal charge accumulator 102 is a component comprising a portion of the photodiode 11 (see FIG. 6) and accumulates signal charges generated from input light.

The surface shield layer 106 is formed in an upper region with respect to the signal charge accumulator 102 in FIG. 7A in order to reduce dark current. Also, the signal outputter 105 is formed away from both the signal charge accumulator 102 and the surface shield layer 106. In a region adjacent to the surface shield layer 106, a STI (Shallow Trench Isolation) region 107 is formed. It should be noted the STI region 107 is formed in regions separating adjacent image pixels 10 and the peripheral regions of the photodiodes 11 except for the transmission transistors 12. Here, even higher separation effect can be obtained if an injection layer for separation is formed below the STI regions (not shown in figures).

A gate oxide film 103 is formed on the surface of the p-well 101 in a region from a point between the signal outputter 105 and the surface shield layer 106 to a point above the signal outputter 105 such that a part of the gate oxide film partially covers the signal outputter 105. The gate 104 of the transmission transistor 12 (hereinafter, referred to as "transmission gate") is laminated on the gate oxide film 103.

A silicide layer 201 (a first compound layer composed of metal and semiconductor) is laminated on a portion of the upper surface of the transmission gate 104. And, the transmission gate 104, signal outputter 105, and surface shield layer 106 are covered by an insulating layer 121 except for the upper surface of the silicide layer 201. It should be noted that as shown in FIG. 7A, the signal outputter 105 is not in contact with the silicide layer, and the upper surface of the signal outputter 105 is covered by the gate oxide film 103 and the insulating layer 121. It should be also noted that the signal charge accumulator 102 is not in contact with the silicide layer, either. Here, a junction depth of the signal outputter 105 is 0.05 [μm] to 0.3 [μm].

Note that the silicide layer 201 of the present embodiment is formed by, for example, using the salicide (Self Aligned Silicide) method.

(2) Reset Transistor 15 and Peripheral Regions Thereof

Figure 7B:
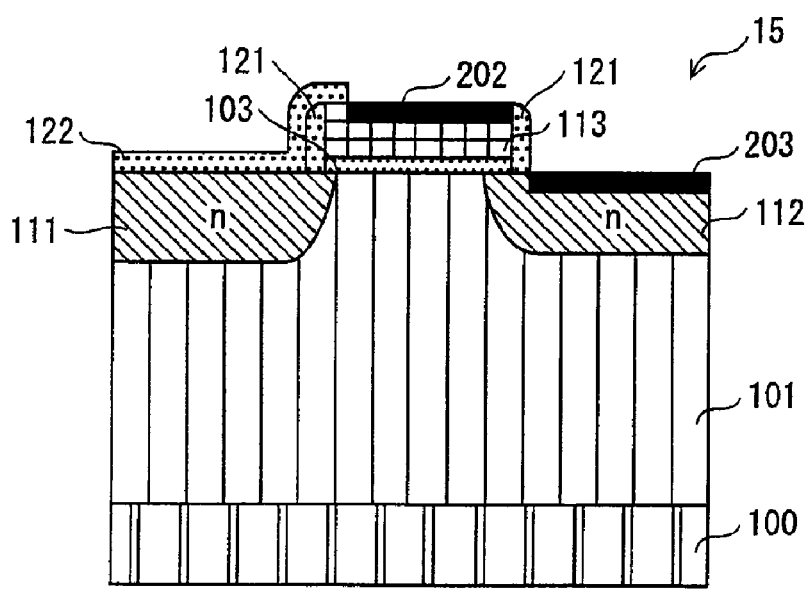
FIG. 7B is a schematic cross-sectional diagram showing a structure of a reset transistor 15 and peripheral regions thereof in the MOS-type solid-state imaging device 1.

As shown in FIG. 7B, at the reset transistor 15 and peripheral regions thereof, the source 111 and the drain 112 of the reset transistor 15 are formed apart from each other in a vicinity of the surface of the p-well 101 included in the semiconductor substrate 100. A silicide layer (a third compound layer composed of metal and a semiconductor material) 203 is laminated on a portion of the upper surface of the drain 112, and the gate oxide film 103 is formed on the surface of the p-well 101 above a region between the source 111 and the drain 112. The gate 113 of the reset transistor 15 (hereinafter, referred to as "reset gate") is laminated on the upper surface of the gate oxide layer 103. Here, a junction depth of the source 111 and the drain 112 of the reset transistor 15 is 0.05 [μm] to 0.3 [μm].

A silicide layer (a second compound layer composed of metal and a semiconductor) 202 is laminated on the surface of the reset gate 113. Additionally, the surface of the p-well 101 is covered by the insulating layer 121 except for the region, where the silicide layer 203 is formed, on the drain 112, and the region, where the silicide layer 202 is formed, on the reset gate 113.

It should be noted that as shown in FIG. 7B, the upper surface of the source 111 of the reset transistor 15 (upper surface of the semiconductor diffusion layer) is not in contact with any silicide layers and covered by the gate oxide layer 103 and the insulating layer 121. The upper surface of the reset gate 113 is, as mentioned above, in contact with the silicide layer 202, and the upper surface of the drain 112 is in contact with the silicide layer 203.

Also, the silicide layers (compound layers composed of metal and a semiconductor) 202 and 203 are, for example, formed by using the salicide (Self Aligned Silicide) method.

4. Connection Structure among Image Pixels 10 of Sensor Region 21

Figure 8:
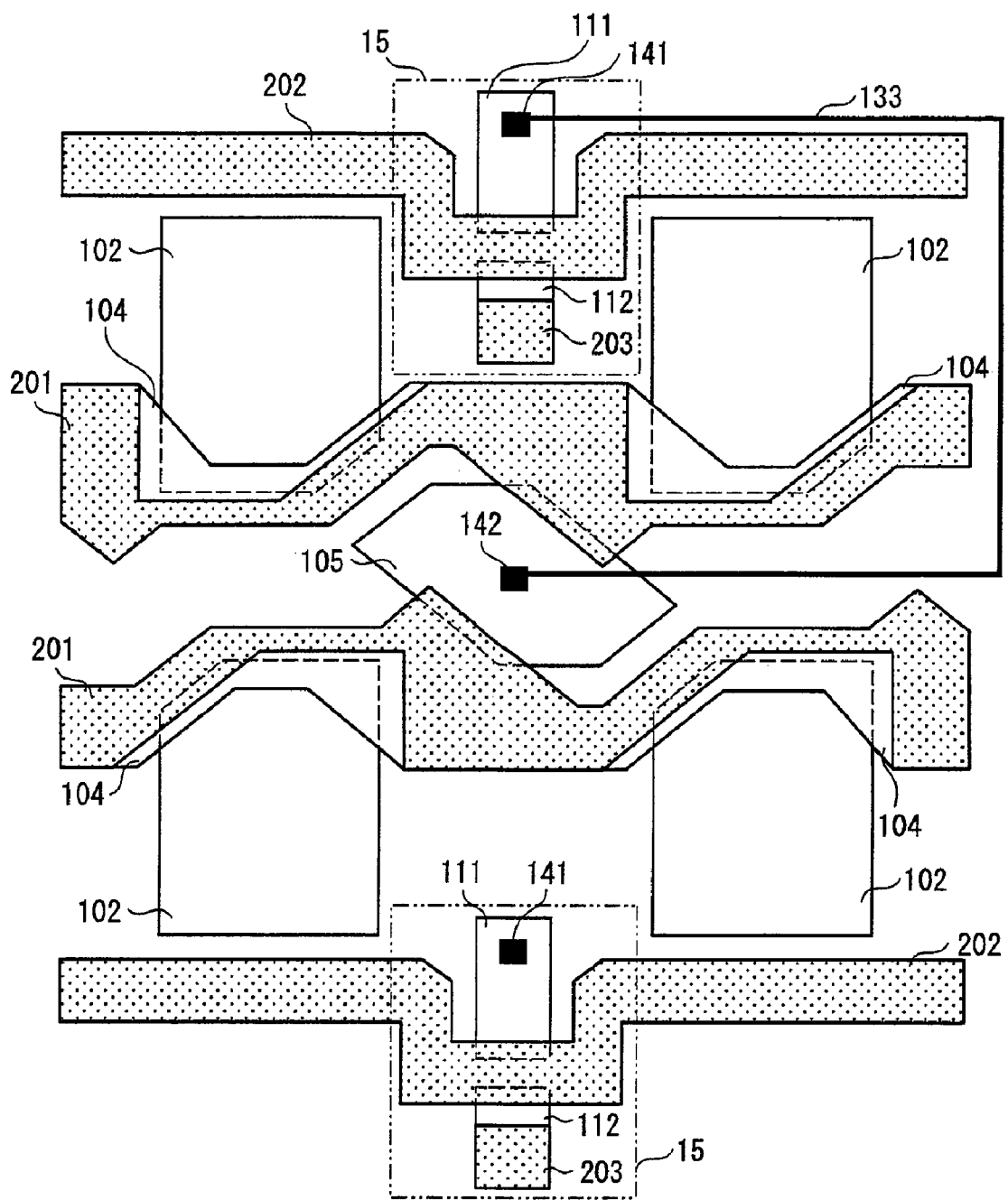
FIG. 8 is a schematic plan diagram showing a wiring in a portion of a sensor region 21 of the MOS-type solid-state imaging device 1.

The following describes a connection structure among the image pixels 10 of the sensor region 21, referring to FIG. 8. Note that FIG. 8 shows a portion of structural components of four image pixels 10 that comprise one group in relation to the signal outputter 105.

As shown in FIG. 8, each signal charge accumulator 102 is rectangular in shape with one of the corners thereof taper-cut, and four signal charge accumulators 102 are arranged in a matrix state. The reset transistor 15 is formed between two signal charge accumulators 102, and the reset gate 113 (FIG. 8 shows the silicide layer 202 laminated on the reset gate 113) is formed laterally penetrating a plurality of the image pixels 10. In other words, the reset gates 113 in the image pixels 10 are connected with the silicide layer 202 laminated thereon.

The source 111 and the drain 112 of the reset transistor 15 are formed in a rectangular shape, the longitudinal sides thereof paralleling the lateral sides of the paper. Of these, the drain 112 has the silicide layer 203 laminated over a partial upper surface thereof. The drain 112 of the reset transistor 15, which is also not shown in figure, is connected with the power supply voltage VDD by the silicide layer 203 laminated thereon.

Additionally, the transmission gate 104 is formed substantially in parallel to the reset gate 113. As mentioned above, the silicide layer 201 is laminated over a portion of the upper surface of the transmission gate 104. The respective transmission gates 104, which are arranged in the horizontal direction of the paper surface, of the image pixels 10 are also connected with the silicide layer 201 laminated thereon.

The MOS-type solid-state imaging device 1 of the present embodiment adopts a structure in which two signal charge accumulators 102 arranged in a matrix state share one signal outputter 105. That is to say, the transmission gate 104 corresponding to the signal charge accumulator 102 at the upper right of the paper surface and the transmission gate 104 corresponding to the signal charge accumulator 102 at the lower left are formed to correspond to the one signal outputter 105. With this structure, the signal charges of the four signal charge accumulators 102 are output to the one signal outputter 105 based on the input signals to the transmission gates 104.

Also, as shown in FIG. 8, the MOS-type solid-state imaging device 1 of the present embodiment has a structure such that the signal outputter 105 and the source 111 of the reset transistor 15 are both not in contact with any silicide layer, and are in contact with each other via contact plugs 141 and 142 by the metal wiring 133. It should be noted that while being schematically shown in FIG. 8, the metal wiring 133 is formed with different layers sandwiching an inter-layer insulating film. Also, as shown in FIG. 6 and the like, the MOS-type solid-state imaging device 1 includes the plurality of the image pixels 10 in a matrix state, and FIG. 8 shows a portion thereof.

5. Advantages of MOS-Type Solid-State Imaging Device 1

As described above, the MOS-type solid-state imaging device 1 of the present embodiment is structured in such a manner that the silicide layer 201 is laminated on a portion of the transmission gate 104, and the transmission gates 104 between the adjacent image pixels 10 are connected by the silicide layer 201. Also, on the upper surface of the reset gate 113, the silicide layer 202 is laminated, and the reset gates 113 between the adjacent image pixels 10 are connected with the silicide layer 202.

With the above structure, wiring resistance can be reduced in the MOS-type solid-state imaging device 1 in accordance with the present embodiment. Additionally, with the MOS-type solid-state imaging device 1, it is not necessary to increase the number of metal wiring layers for connecting the transmission gates 104 with one another and for connecting the reset gates 113 with one another. Accordingly, a distance from an on-chip lens to the photodiode 11 on the surface of the silicon substrate can be shortened, achieving high sensitivity characteristics. This is described in the following with FIG. 9. It should be noted that in FIG. 9, the semiconductor substrate 100 is omitted and only a portion from the p-well 101 up is shown.

Figure 2A:
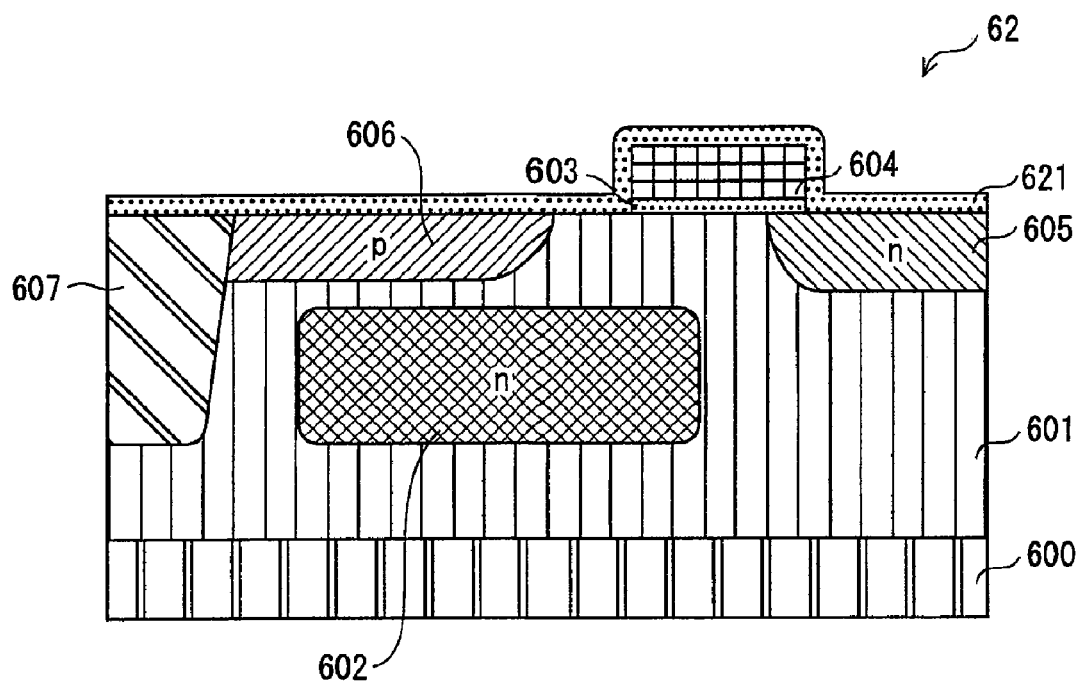
FIG. 2A is a schematic cross-sectional diagram showing a structure of a transmission transistor 62 and peripheral regions thereof of the conventional MOS-type solid-state imaging device.
Figure 2B:
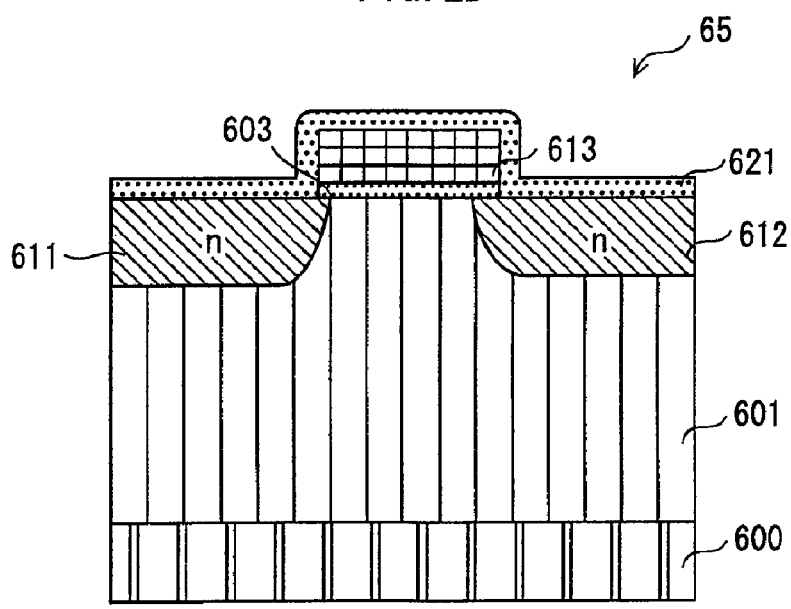
FIG. 2B is a schematic cross-sectional diagram showing a structure of a reset transistor 65 and peripheral regions thereof of the conventional MOS-type solid-state imaging device.
Figure 9:
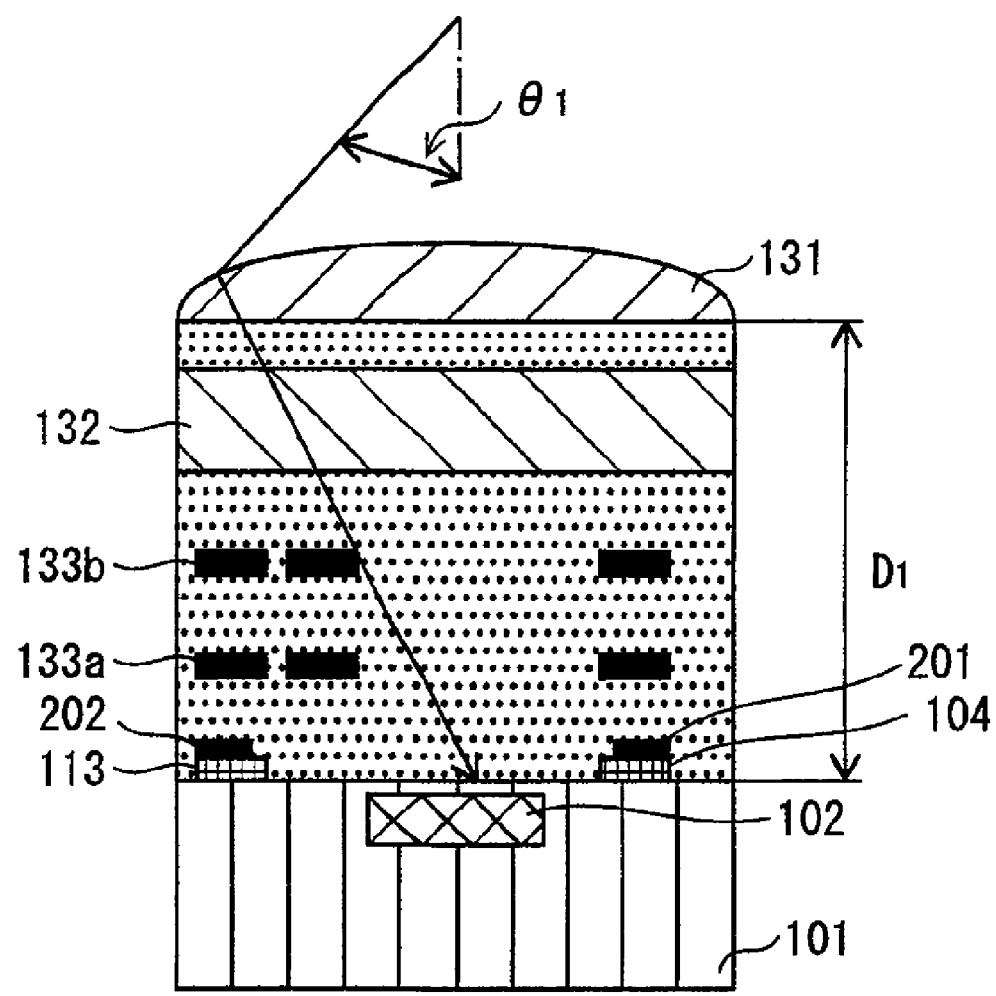
FIG. 9 is a schematic cross-sectional diagram showing a partial structure of an image pixel of the MOS-type solid-state imaging device 1.

As shown in FIG. 9, in the MOS-type solid-state imaging device 1 of the present embodiment, the transmission gates 104 and the reset gates 113 are connected among themselves, respectively, as a result of the image pixels 10 being connected to the silicide layers 201 and 202 laminated thereon. Consequently, the number of the metal wirings 133a and 133b between the on-chip lens 131 and the surface of the p-well 101 can be reduced by at least one layer, compared to the conventional MOS-type solid-state imaging device shown in FIGS. 2 and 3.

Figure 3:
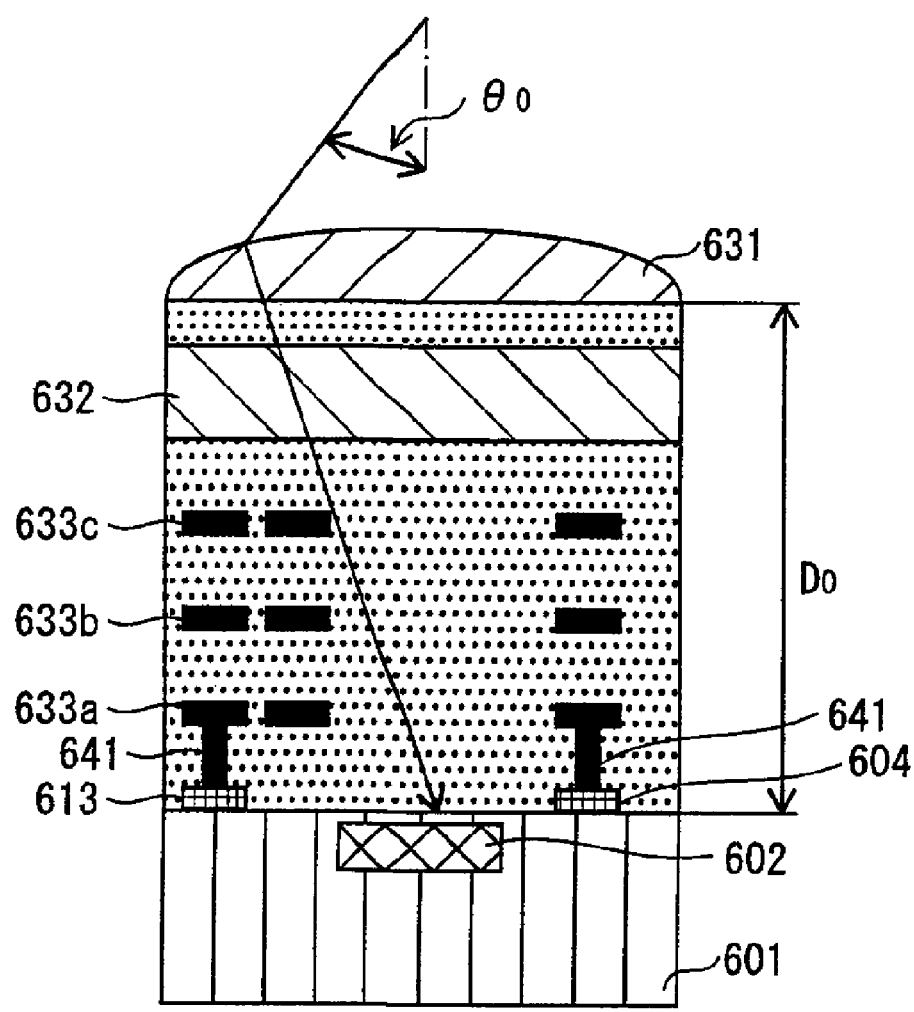
FIG. 3 is a schematic cross-sectional diagram showing a partial structure of an image pixel of the conventional MOS-type solid-state imaging device.
Figure 4:
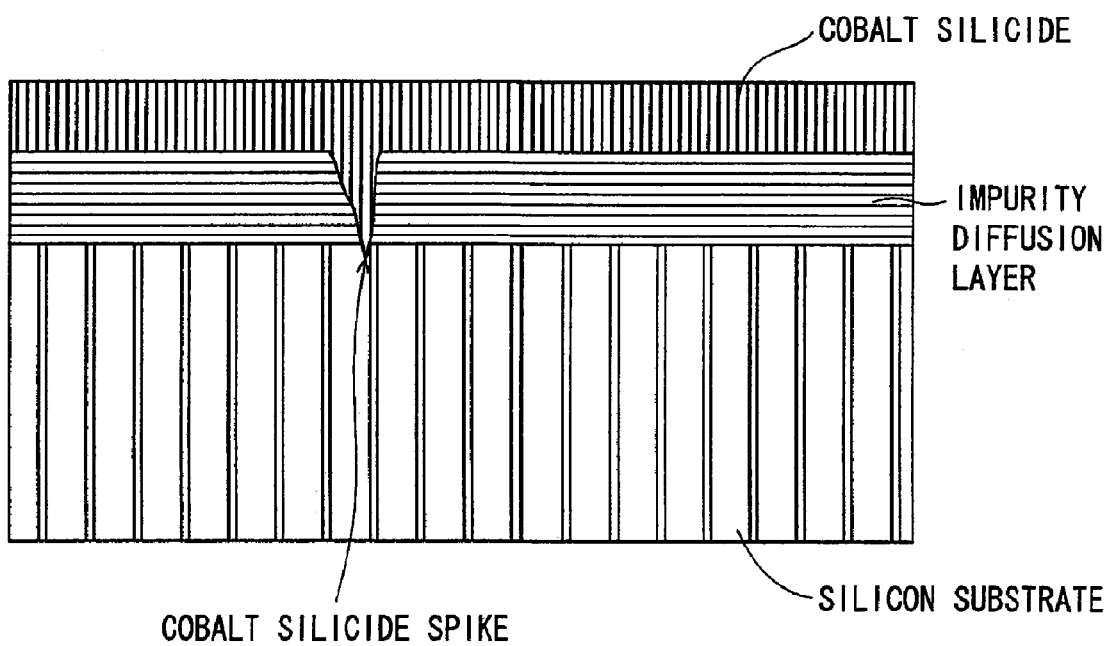
FIG. 4 is a schematic cross-sectional diagram showing a junction damaged by a cobalt silicide spike.

Consequently, with the MOS-type solid-state imaging device 1, a distance D1 from the on-chip lens 131 to the surface of the p-well 101 can be reduced by a difference in the numbers of the metal wiring layers compared to a distance D0 in FIG. 3. Accordingly, a light receivable angle $\theta_1$ becomes larger than the light receivable angle $\theta_0$ in FIG. 3, achieving the high sensitivity characteristics as a result.

Also, in the MOS-type solid-state imaging device 1, no silicide layer is in contact with either of the upper surfaces of the signal outputter 105 or the reset transistor 15. Consequently, with the MOS-type solid-state imaging device 1, it is less likely to have problems such as crystal faults due to implantation of ion in high concentration and penetration of the metal-semiconductor compound into the p-well 101, compared to when a silicide layer is formed on the upper surface of the signal outputter 105.

Figure 10:
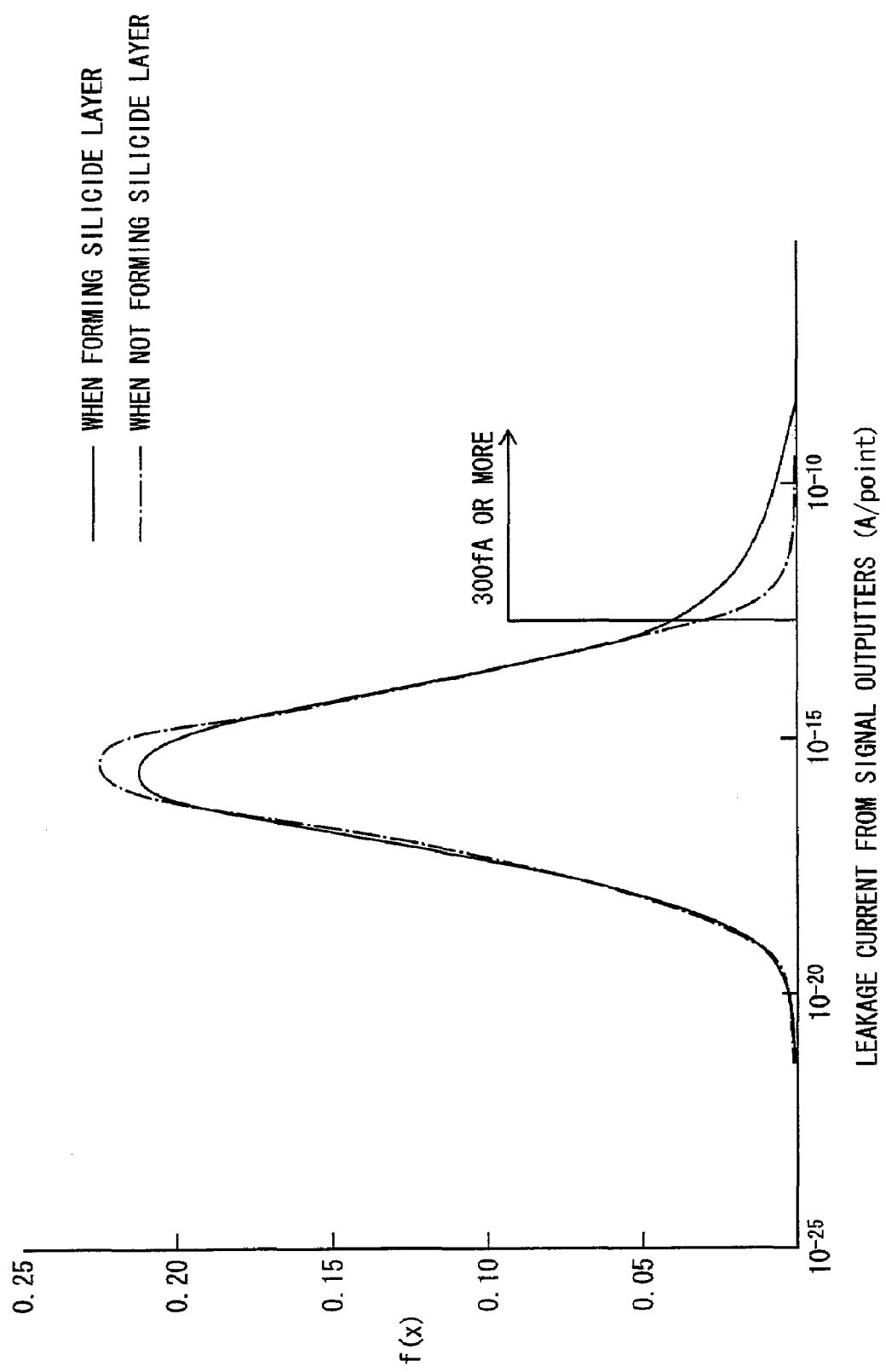
FIG. 10 is a characteristic diagram showing distributions of leakage current from the signal outputters of the MOS-type solid-state imaging device 1 in cases with or without a silicide layer, respectively, under the condition that the total area of the signal outputters 105 and the sources 111 of the reset transistors 15 is 0.48 [μm²] and the peripheral temperature thereof is 60[° C.]

Here, when the peripheral temperature of the several million to ten million signal outputters 105 and the sources 111 of the reset transistors 15, which are electrically connected to the signal outputters 105 is 60[° C.], leakage current shows a distribution as shown in FIG. 10 (indicated by a dashed line) in a case where, for example, a total area of the signal outputters 105 and the sources 11 of the reset transistors 15 is 0.48 [$\mu m^2$]. And, the number of the image pixels with a leakage current of approximately 300 [fA] or more, where the leakage current becomes visible as a noise in a playback image, decreases compared to when a silicide layer is formed (a distribution indicated by a solid line). Consequently, the MOS-type solid-state imaging device 1 in accordance with the present embodiment is less likely to cause leakage current and noise due to aliasing output from the signal outputter 105.

Additionally, the source 111 of the reset transistor 15 charges a floating diffusion layer to a reset level, and the signal outputter 105 converts electrons accumulated at the signal charge accumulator 102 to a voltage change of the floating diffusion layer. In other words, neither of these outputs current, and thus, it is not necessary to laminate a silicide layer thereover to lower resistance.

Accordingly, the MOS-type solid-state imaging device 1 prevents playback images from deteriorating due to leakage current while achieving the high sensitivity characteristics.

6. Manufacturing Method of MOS-Type Solid-State Imaging Device 1

The following describes an embodiment of a manufacturing method of the solid-state imaging device 1 in accordance with the present invention with reference to FIGS. 11A to 16B. FIGS. 11A, 12A, 13A, 14A, 15A, and 16A show a formation region of the transmission transistor 12; and FIGS. 11B, 12B, 13B, 14B, 15B and 16B show a formation region of the reset transistor 15.

Figure 11A:
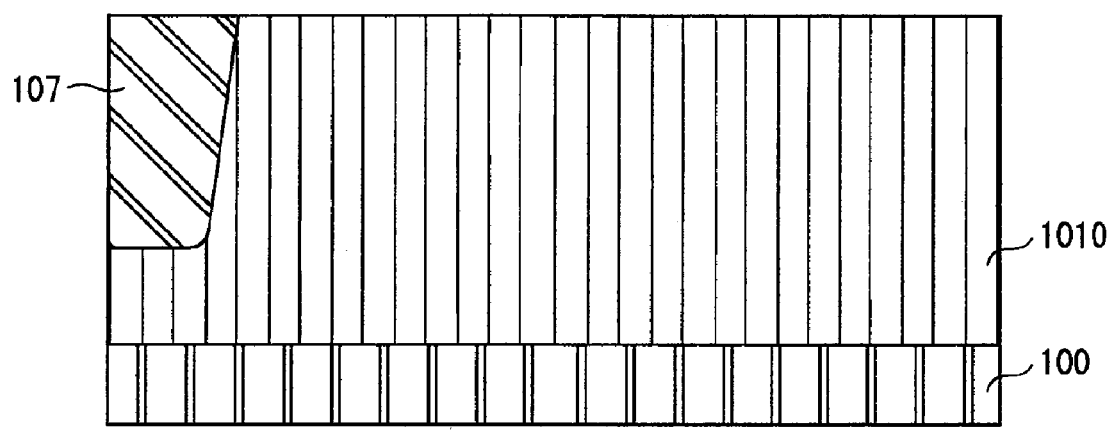
FIG. 11A is a cross-sectional diagram showing a manufacturing process of a predetermined portion of the transmission transistor 12 among manufacturing processes of the MOS-type solid-state imaging device 1.
Figure 11B:
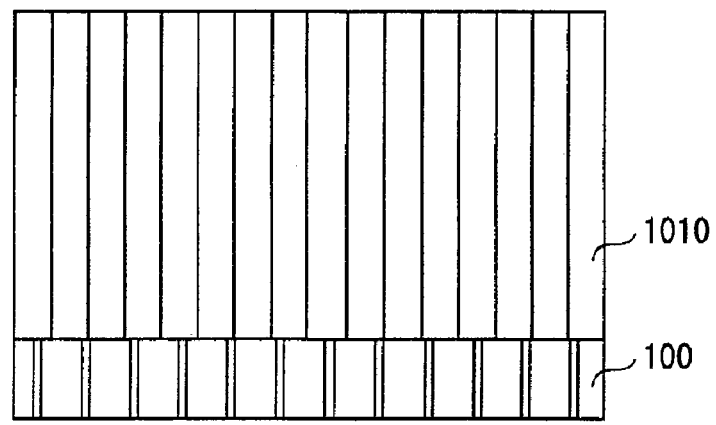
FIG. 11B is a cross-sectional diagram showing a manufacturing process of a predetermined portion of the reset transistor 15 among the manufacturing processes of the MOS-type solid-state imaging device 1.

First, as shown in FIGS. 11A and 11B, a p-well 1010 and an STI (Shallow Trench Isolation) region 107 are included in a semiconductor substrate 100 of an n-type or a p-type. While, in the present embodiment, as shown in FIG. 11A, the STI region 107 is formed only in a region where the transmission transistor 12 is to be formed, the STI region can be formed in regions separating the image pixels 10 and peripheral regions of the photodiodes 11 except for the transmission transistor 12. Also, higher separation effect can be obtained if an injection layer for separation is formed below the STI regions (not shown in figures).

Figure 12A:
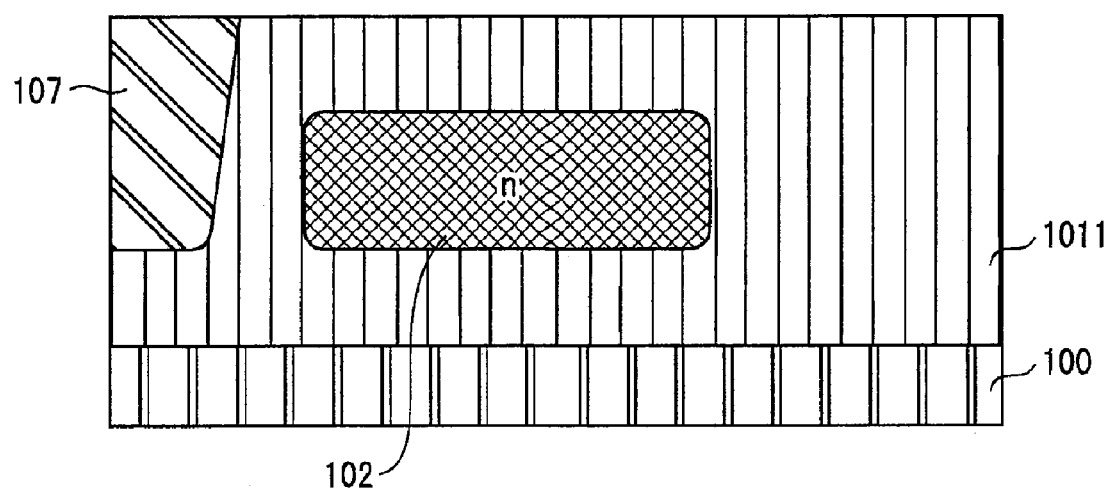
FIG. 12A is a cross-sectional diagram showing a manufacturing process of a predetermined portion of the transmission transistor 12 among the manufacturing processes of the MOS-type solid-state imaging device 1.
Figure 12B:
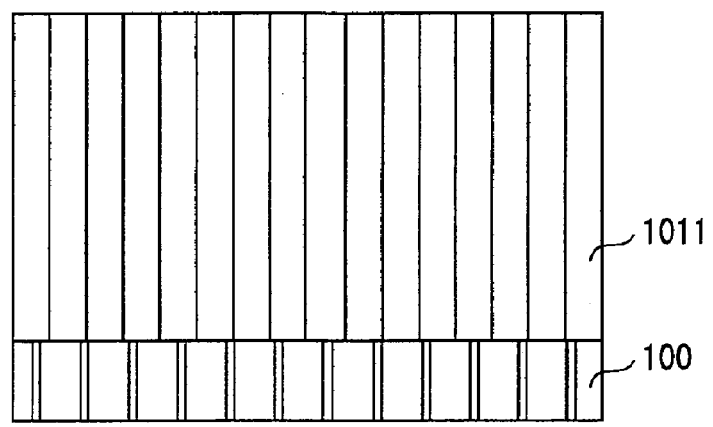
FIG. 12B is a cross-sectional diagram showing a manufacturing process of a predetermined portion of the reset transistor 15 among the manufacturing processes of the MOS-type solid-state imaging device 1.

Next, as shown in FIG. 12A, the signal charge accumulator 102 is formed in the p-well 1011 included in the semiconductor substrate 100. It should be noted that the reference numeral of the p-well 1010 in the FIGS. 11A and 11B is changed to the p-well 1011 in the FIGS. 12A and 12B in consideration of the formation of the signal charge accumulator 102. Similar changes are made in the following processes.

Figure 13A:
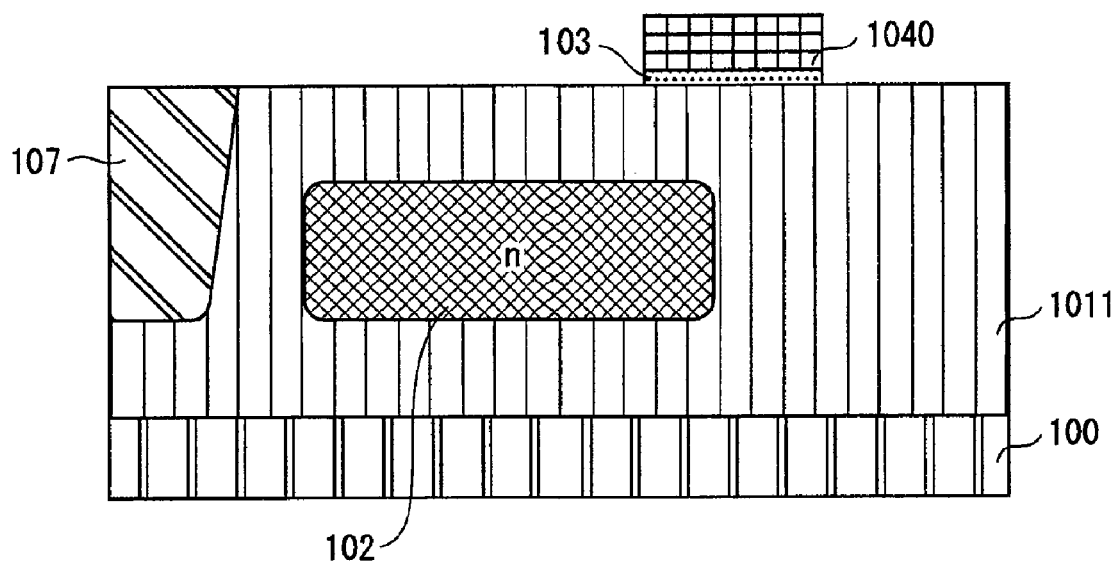
FIG. 13A is a cross-sectional diagram showing a manufacturing process of a predetermined portion of the transmission transistor 12 among the manufacturing processes of the MOS-type solid-state imaging device 1.
Figure 13B:
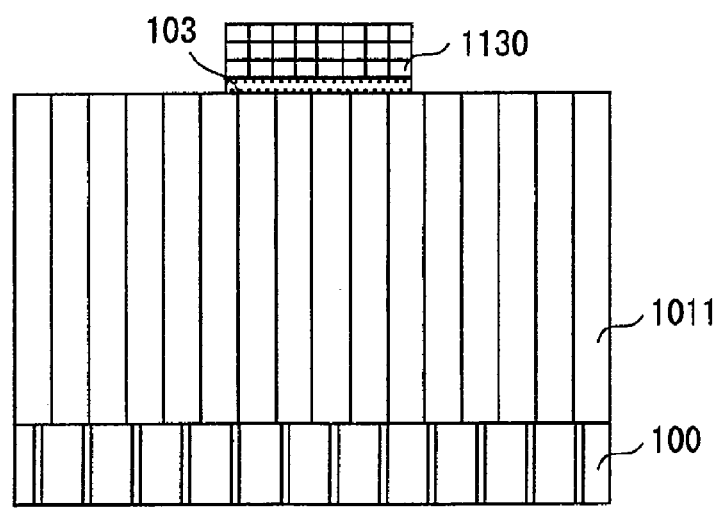
FIG. 13B is a cross-sectional diagram showing a manufacturing process of a predetermined portion of the reset transistor 15 among the manufacturing processes of the MOS-type solid-state imaging device 1.

Following the above, as shown in FIG. 13A, after a silicon oxide film and polysilicon are laminated on the surface of the p-well 1011 on the semiconductor substrate 100, etching is performed to form the gate oxide film 103 and a transmission gate preparatory layer 1040 in the region where the transmission transistor 12 is to be formed. Also, as shown in FIG. 13B, in a region where the reset transistor 15 is to be formed, the gate oxide film 103 and a reset gate preparatory layer 1130 are formed in a similar manner.

Figure 14A:
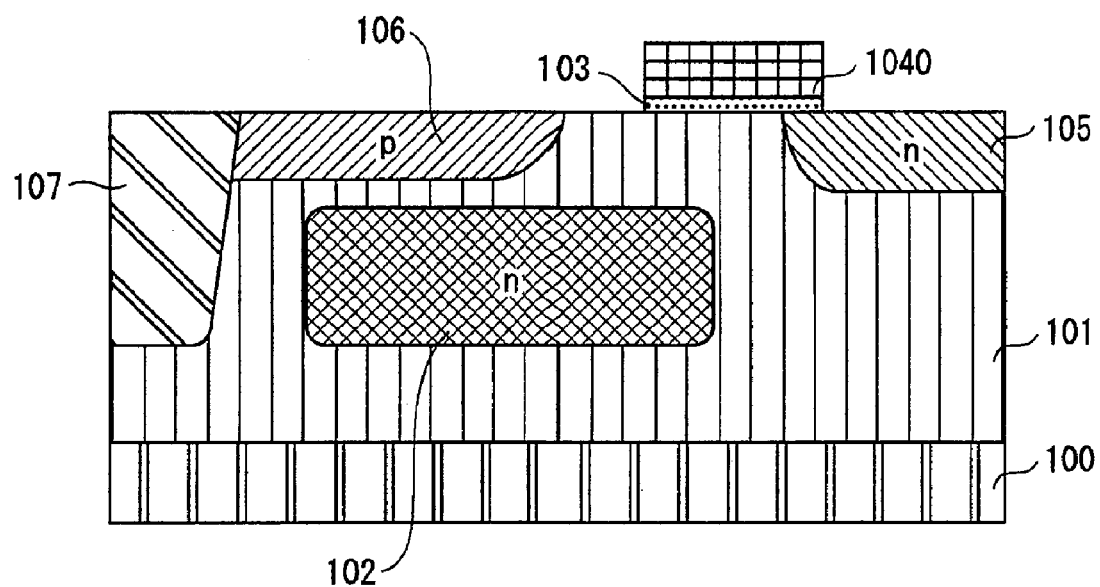
FIG. 14A is a cross-sectional diagram showing a manufacturing process of a predetermined portion of the transmission transistor 12 among the manufacturing processes of the MOS-type solid-state imaging device 1.
Figure 14B:
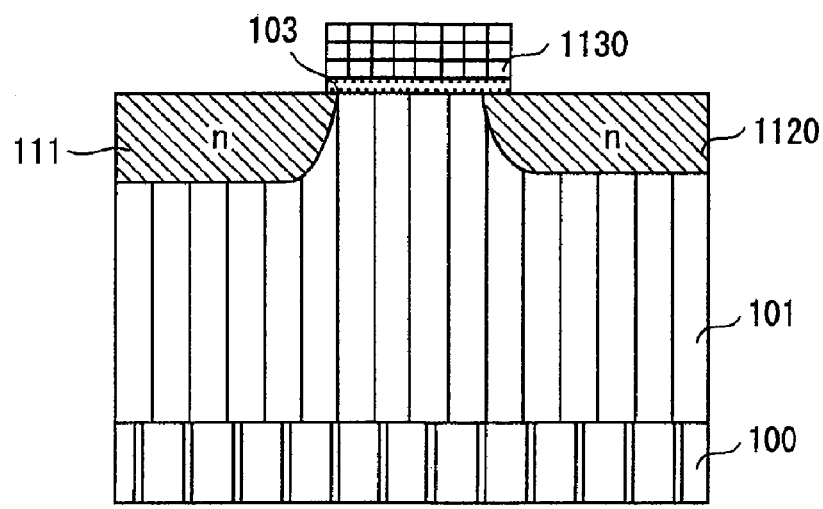
FIG. 14B is a cross-sectional diagram showing a manufacturing process of a predetermined portion of the reset transistor 15 among the manufacturing processes of the MOS-type solid-state imaging device 1.

Next, as shown in FIG. 14A, the surface shield layer 106 is formed, and the signal outputter 105, which is the drain of the transmission transistor 12, is formed. Also, as shown in FIG. 14B, the source 111 of the reset transistor 15 and a drain preparatory region 1120 of the reset transistor 15 are formed.

Figure 15A:
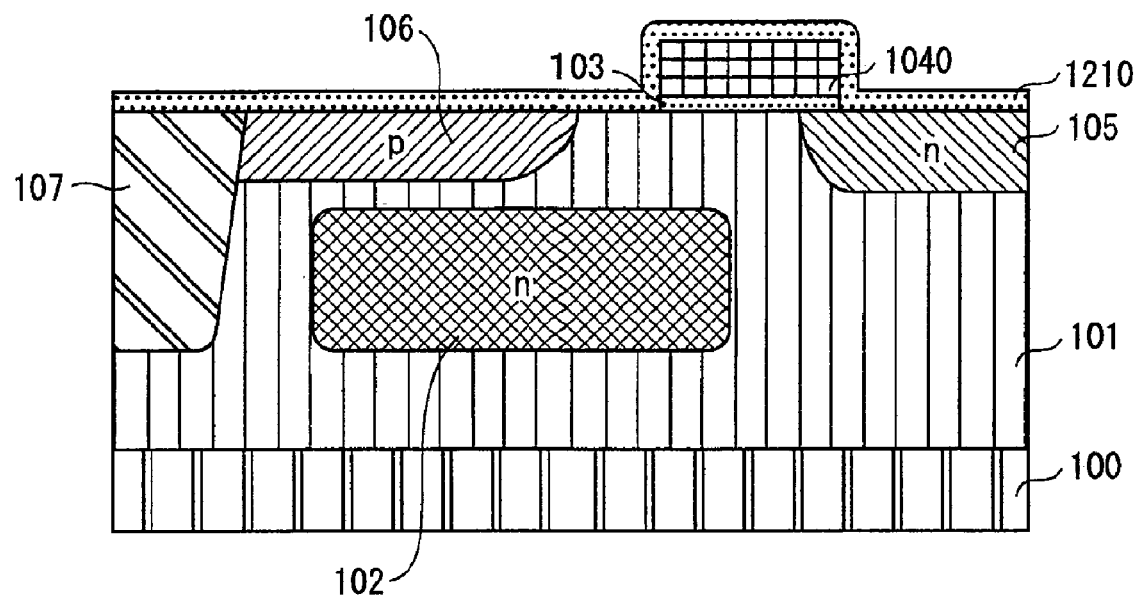
FIG. 15A is a cross-sectional diagram showing a manufacturing process of a predetermined portion of the transmission transistor 12 among the manufacturing processes of the MOS-type solid-state imaging device 1.
Figure 15B:
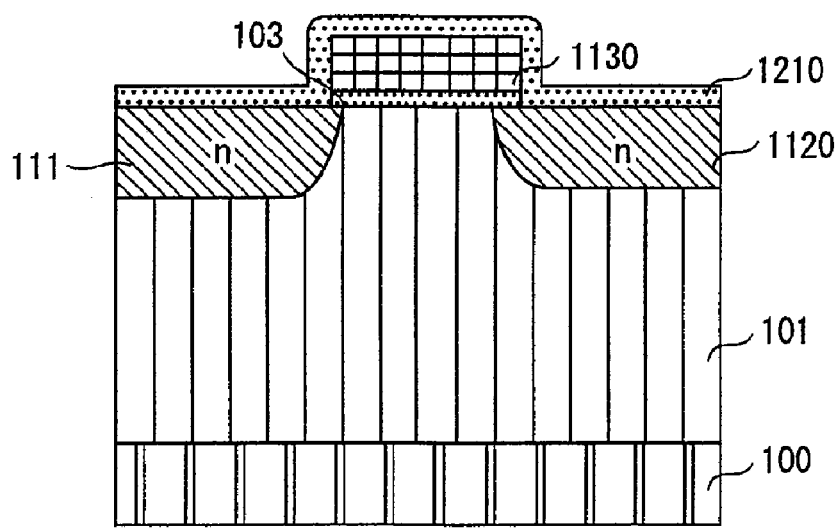
FIG. 15B is a cross-sectional diagram showing a manufacturing process of a predetermined portion of the reset transistor 15 among the manufacturing processes of the MOS-type solid-state imaging device 1.
Figure 16A:
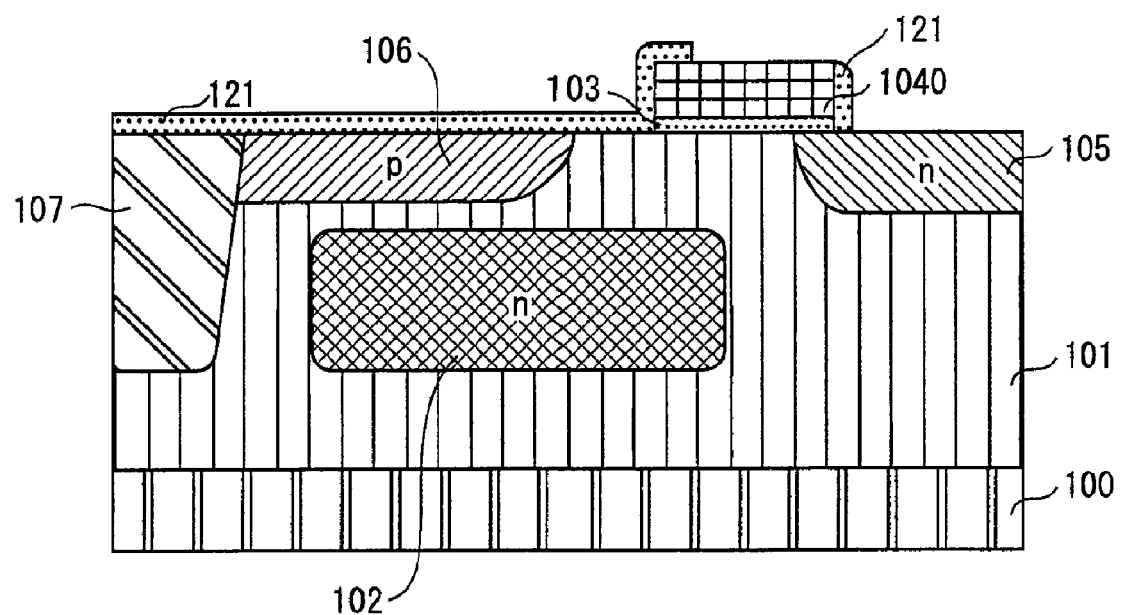
FIG. 16A is a cross-sectional diagram showing a manufacturing process of a predetermined portion of the transmission transistor 12 among the manufacturing processes of the MOS-type solid-state imaging device 1.
Figure 16B:
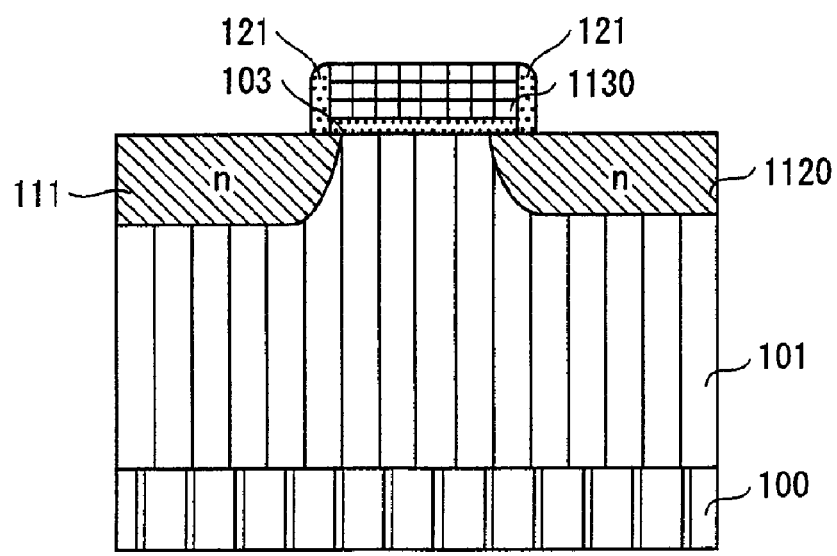
FIG. 16B is a cross-sectional diagram showing a manufacturing process of a predetermined portion of the reset transistor 15 among the manufacturing processes of the MOS-type solid-state imaging device 1.

Subsequently, as shown in FIGS. 15A and 15B, an insulating preparative layer 1210 is formed so as to cover the upper surface of the p-well 101 included in the semiconductor substrate 100, the transmission gate preparative layer 1040, and the reset gate preparative layer 1130. And, as shown in FIGS. 16A and 16B, an opening is formed for the insulating preparative layer 1210 by etching the region except for the upper surface of the signal discharge accumulator 102. This leaves the insulating layer 121 on the upper surface of the signal charge accumulator 102.

Also, as shown in FIGS. 16A and 16B, the insulating layer 121 remains as a side wall on a right lateral surface (lateral surface on the drain side) of the transmission gate preparative layer 1040 and on both lateral surfaces of the reset gate preparative layer 1130.

Figure 17A:
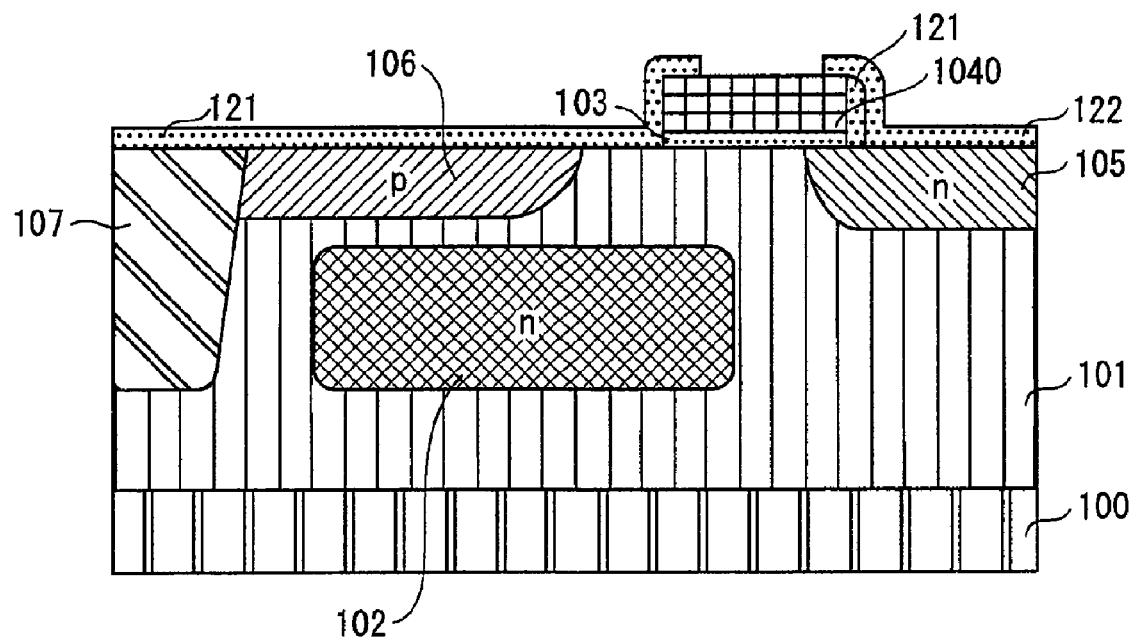
FIG. 17A is a cross-sectional diagram showing a manufacturing process of a predetermined portion of the transmission transistor 12 among the manufacturing processes of the MOS-type solid-state imaging device 1.
Figure 17B:
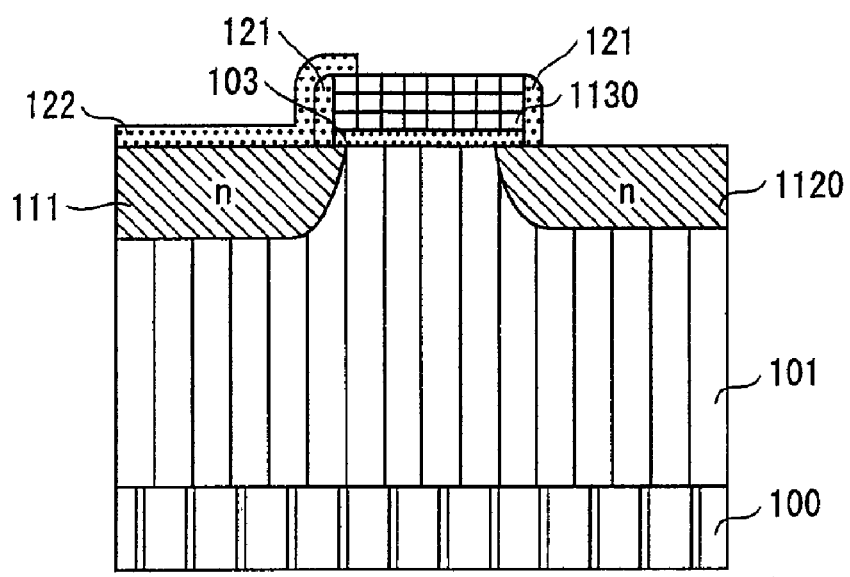
FIG. 17B is a cross-sectional diagram showing a manufacturing process of a predetermined portion of the reset transistor 15 among the manufacturing processes of the MOS-type solid-state imaging device 1.

Next, again, an insulating preparative layer is formed so as to cover the upper surface of the p-well 101 included in the semiconductor substrate 100, the transmission gate preparative layer 1040 and the reset gate preparative layer 1130. After that, as shown in FIGS. 17A and 17B, an opening is provided above the transmission gate preparative layer 1040, the reset gate preparative layer 1130, and the drain preparative region 1120 of the reset transistor 15. It should be noted that the insulating layer 121 is left above the signal charge accumulator 102, the signal outputter 105, and the source 111 of the reset transistor 15.

Next, at the status shown in FIGS. 17A and 17B, the exposed surfaces of the transmission gate preparative layer 1040, the reset gate preparative layer 1130, and the drain preparative region 1120 of the reset transistor 15 are silicided, forming the silicide layers 201, 202, and 203 (see FIGS. 7A and 7B).

The MOS-type solid-state imaging device 1 which is manufactured through the above processing is structured such that the surfaces of the signal charge accumulator 102, the signal outputter 105, and the source 111 of the reset transistor 15 are not silicided, which prevents generation of leakage current. At the same time, a metal-semiconductor compound (silicide layers 201, 202, and 203) is laminated on the transmission gate 104, the reset gate 113, and the drain 112 of the reset transistor 15, lowering connection resistance.

7. Additional Particulars

The above-mentioned embodiment only provides an example to describe the structure of the present invention and the effects obtained therewith. Accordingly, the present invention is not restricted to the above-mentioned embodiment except for its characterizing aspects. For instance, as shown in FIG. 8, a layout adopted by the MOS-type solid-state imaging device 1 of the above-mentioned embodiment can be appropriately changed, allowing an adoption of various structures other than the structure in which two signal charge accumulators 102 share one signal outputter 105.

Also, while the number of the layers of the metal wirings 133 is shown as two (layers 133a and 133b) in FIG. 9, this is only schematic, and thus the number of the layers of the metal wirings 133 is not limited to this.

Further, in the above-mentioned embodiment, every image pixel 10 of the sensor region 21 is configured to have the structure of the present invention, that is, the silicide layers 201, 202, and 203 (silicide layer) disposed at the above-mentioned corresponding regions. However, since not all the image pixels 10 need to have the above-mentioned structure, a portion of the image pixels 10 can have the above-mentioned structure. For instance, silicide can be used or not used in accordance with regions of the sensor region 21. Also, in the present embodiment, a silicide layer is defined as a metal-semiconductor compound, as a silicon substrate is adopted as a semiconductor substrate. However, the present invention does not limit the metal-semiconductor compound to silicide.

Further, metal used to form a silicide layer is not limited to cobalt, and can be other metal materials such as nickel.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A solid-state imaging device in which a plurality of image pixels are disposed in a direction along a main surface of a semiconductor substrate, each of the plurality of image pixels including:
   a signal charge accumulator operable to accumulate a signal charge generated by a photoelectric conversion;
   a transmission transistor disposed adjacent to the signal charge accumulator; and
   a reset transistor, a source of which is connected to a drain of the transmission transistor, wherein
   one of (a) the drain of the transmission transistor and (b) a point on a signal path connecting the drain of the transmission transistor and the source of the reset transistor functions as a signal outputter,
   a gate of the transmission transistor is in contact with a first compound layer composed of metal and a semiconductor, and a gate of the reset transistor is in contact with a second compound layer composed of metal and a semiconductor,
   gates of transmission transistors of at least two of the image pixels are electrically connected with each other by a first interconnect which is unified with the gates of transmission transistors and in contact with the first compound layer in the direction along the main surface, and gates of reset transistors of the at least two of the image pixels are electrically connected with each other by a second interconnect which is unified with the gates of reset transistors and in contact with the second compound layer in the direction along the main surface, and
   the signal outputter (i) is out of contact with the first compound layer, the second compound layer, and any other compound layer composed of metal and a semiconductor, (ii) has a top surface that is covered with an insulating layer, and (iii) is electrically connected with a metal wiring layer so as to be connected with other transistors, the metal wiring layer being disposed on the insulating layer.

2. The solid-state imaging device of claim 1, wherein
   the source of the reset transistor (i) is out of contact with the first compound layer, the second compound layer, and any other compound layer composed of metal and a semiconductor, (ii) has a top surface that is covered with an insulating layer, and (iii) is electrically connected with a metal wiring layer disposed on the insulating layer, and
   the source of the reset transistor and the signal outputter are electrically connected.

3. The solid-state imaging device of claim 2, wherein the drain of the reset transistor is in contact with a third compound layer composed of metal and a semiconductor.

4. The solid-state imaging device of claim 1, wherein
   a peripheral circuit region including a plurality of transistors is positioned at a periphery of where the plurality of image pixels are disposed in the direction along the main surface of the semiconductor substrate, and
   sources, drains, and gates of the plurality of transistors are in contact with a fourth compound layer composed of metal and a semiconductor so as to be electrically connectable.

5. The solid-state imaging device of claim 1, wherein the first compound layer and the second compound layer are formed using a salicide method.

6. The solid-state imaging device of claim 1, wherein
   the plurality of image pixels are grouped into a plurality of pixel groups each composed of two or more adjacent image pixels, and
   in at least one of the plurality of pixel groups, image pixels thereof share one signal outputter.

7. The solid-state imaging device of claim 1, wherein
   a shield layer is disposed on the signal charge accumulator, the shield layer being capable of reducing dark current, and
   the shield layer (i) is out of contact with the first compound layer, the second compound layer, and any other compound layer composed of metal and a semiconductor and (ii) has a top surface that is covered with an insulating layer.

8. A manufacturing method for a solid-state imaging device in which a plurality of image pixels are disposed in a direction along a main surface of a semiconductor substrate, comprising:
   (a) a signal charge accumulator forming step of performing, on a semiconductor substrate, formation of a signal charge accumulator which accumulates a signal charge generated by a photoelectric conversion;
   (b) a transistor and an interconnect forming step of performing, on the semiconductor substrate, formation of (i) a transmission transistor adjacent to the signal charge accumulator, (ii) a reset transistor, a source of which is connected to a drain of the transmission transistor, (iii) a first interconnect which connects and is unified with gates of the transmission transistors of at least two of the image pixels, and (iv) a second interconnect which connects and is unified with gates of the reset transistors of at least two of the image pixels;

(c) a first insulating layer forming step of forming a first insulating layer so as to cover (i) a main surface of the semiconductor substrate, (ii) the transmission transistor, and (iii) the reset transistor;

(d) a sidewall forming step of forming, by removing the first insulating layer by etching except for a region above the signal charge accumulator, a sidewall on a lateral surface of a gate of the transmission transistor and on both lateral surfaces of a gate of the reset transistor, the lateral surface of the gate of the transmission transistor being on a drain side of the transmission transistor;

(e) a second insulating layer forming step of forming a second insulating layer so as to cover (i) the main surface, (ii) the transmission transistor, and (iii) the reset transistor;

(f) an opening forming step of forming, on the second insulating layer, an opening above the gate of the transmission transistors, above the gate and the drain of the reset transistor, and above the first and second interconnects; and (g) a compound layer forming step of forming, through the openings, a compound layer composed of metal and a semiconductor on the gate of the transmission transistor and on the gate and the drain of the reset transistor and the first and second interconnects.

* * * * *